US012798236B2

(12) United States Patent
Tokuda

(10) Patent No.: US 12,798,236 B2
(45) Date of Patent: Nov. 17, 2026

(54) FLEXIBLE ELECTRIC WIRING SUBSTRATE AND CHIP UNIT AND METHOD OF INSPECTING FLEXIBLE ELECTRIC WIRING SUBSTRATE

(71) Applicant: CANON KABUSHIKI KAISHA, Tokyo (JP)

(72) Inventor: Takamitsu Tokuda, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 221 days.

(21) Appl. No.: 18/602,732

(22) Filed: Mar. 12, 2024

(65) Prior Publication Data

US 2024/0336065 A1 Oct. 10, 2024

(30) Foreign Application Priority Data

Apr. 7, 2023 (JP) ................................. 2023-062973

(51) Int. Cl.
*B41J 2/14* (2006.01)
*B41J 2/16* (2006.01)
*G01R 31/28* (2006.01)

(52) U.S. Cl.
CPC ......... *B41J 2/14201* (2013.01); *B41J 2/1643* (2013.01); *G01R 31/2884* (2013.01); *B41J 2002/14491* (2013.01)

(58) Field of Classification Search
CPC .................. B41J 2/14201; B41J 2/1643; B41J 2002/14491; G01R 31/2884
See application file for complete search history.

(56) References Cited

U.S. PATENT DOCUMENTS

| | | | | | |
|---|---|---|---|---|---|
| 4,894,015 | A * | 1/1990 | Stockero | H05K 3/363 | 29/842 |
| 5,164,747 | A * | 11/1992 | Osada | B41J 2/1643 | 347/19 |
| 5,521,520 | A * | 5/1996 | Yoshizawa | G01R 1/04 | 324/762.01 |
| 6,076,914 | A * | 6/2000 | Imai | B41J 2/04541 | 347/50 |
| 6,619,785 | B1 * | 9/2003 | Sato | H01R 43/0214 | 347/50 |
| 2006/0141864 | A1 * | 6/2006 | Suzuki | B41J 2/14209 | 439/595 |

(Continued)

FOREIGN PATENT DOCUMENTS

| | | | | |
|---|---|---|---|---|
| JP | 2004252331 | A | * | 9/2004 |
| JP | 2006-234639 | A | | 9/2006 |

OTHER PUBLICATIONS

Translation of JP 2004252331 A (Year: 2004).*

*Primary Examiner* — Paresh Patel
(74) *Attorney, Agent, or Firm* — VENABLE LLP

(57) ABSTRACT

Provided is a flexible electric wiring substrate including multiple groups each including wiring, a connector land that electrically connects a terminal of a connector to the wiring, a pad that connects a terminal of an electronic part to the wiring, and a plating lead that is electrically connected with the pad through the wiring and is used as a current supply port at least in a case of electrolytic plating of the pad, in which the multiple plating leads are arranged such that each of multiple inspection probes arrayed on a probe holding substrate is abutted onto each plating lead.

19 Claims, 23 Drawing Sheets

(56) References Cited

U.S. PATENT DOCUMENTS

| | | | | |
|---|---|---|---|---|
| 2006/0187649 | A1* | 8/2006 | Imai | H05K 3/361 257/E21.514 |
| 2007/0211115 | A1* | 9/2007 | Ibe | B41J 2/1643 347/58 |
| 2008/0246824 | A1* | 10/2008 | Silverbrook | B41J 2/1408 347/85 |
| 2012/0086759 | A1* | 4/2012 | Takada | B41J 2/14201 347/71 |
| 2017/0266969 | A1* | 9/2017 | Kashimura | B41J 2/04541 |
| 2018/0086068 | A1* | 3/2018 | Kakiuchi | B41J 3/543 |
| 2019/0143690 | A1* | 5/2019 | Fujioka | H10N 30/2047 347/71 |

* cited by examiner

| FIG.9A | FIG.9B |
|---|---|

FLEXIBLE ELECTRIC WIRING SUBSTRATE AND CHIP UNIT AND METHOD OF INSPECTING FLEXIBLE ELECTRIC WIRING SUBSTRATE

BACKGROUND OF THE DISCLOSURE

Field of the Invention

The present disclosure relates to a flexible electric wiring substrate and a chip unit and a method of inspecting the flexible electric wiring substrate.

Description of the Related Art

In an ink jet type printing apparatus using a driving element such as a piezoelectric element, ink is ejected from a pressure chamber through a nozzle by applying a driving signal that changes depending on printing contents to the driving element such as the piezoelectric element. Additionally, in the printing apparatus, a chip unit including a flexible electric wiring substrate and a driving element substrate is used. Multiple driving elements are mounted on the driving element substrate, and the flexible electric wiring substrate includes wiring to supply the driving signal inputted from a main body of the printing apparatus to the driving element substrate. In order to inspect in a manufacturing step whether, for example, an implemented part in the flexible electric wiring substrate is implemented with no problem and operates correctly, an inspection device is connected to the wiring of the flexible electric wiring substrate to perform an electric inspection. In this case, the problem is how to connect wiring of the inspection device to the wiring of the flexible electric wiring substrate. In a case where a substrate-to-substrate connector, which connects the wiring of the flexible electric wiring substrate with wiring of a substrate on a higher level side in the printing apparatus, is provided to the flexible electric wiring substrate, usually, the substrate-to-substrate connector is also used for the connection with the wiring of the inspection device. In this case, a connector on an inspection device side is fitted to the substrate-to-substrate connector.

However, in general, due to a problem of the durability and the like, the connector reaches the end of the lifetime with about 50 times of fitting. Therefore, there has been a problem in a case of inspecting many flexible electric wiring substrates that the connector on the inspection device side needs to be replaced frequently. Note that, Japanese Patent Laid-Open No. 2006-234639 (hereinafter, referred to as a literature) discloses a technique of abutting a spring probe held by a displaceable probe holding member onto the connector by displacing the probe holding member to inspect an inspected object. However, in the technique of the literature, a contact needs to be inserted in and removed from a through-hole every time the inspected object is replaced, and the spring probe is a structure. Accordingly, in terms of the accuracy and the strength, it is difficult to apply the technique of the literature to a connector with a narrow pitch like the substrate-to-substrate connector provided to the flexible electric wiring substrate used in the printing apparatus.

SUMMARY OF THE DISCLOSURE

The present disclosure is a flexible electric wiring substrate that includes multiple groups each including wiring, a connector land that electrically connects a terminal of a connector to the wiring, a pad that connects a terminal of an electronic part to the wiring, and a plating lead that is electrically connected with the pad through the wiring and is used as a current supply port at least in a case of electrolytic plating of the pad, in which the multiple plating leads are arranged such that each of multiple inspection probes arrayed on a probe holding substrate is abutted onto each plating lead.

Further features of the present disclosure will become apparent from the following description of exemplary embodiments with reference to the attached drawings.

BRIEF DESCRIPTION OF THE DRAWINGS

FIG. 9 is a diagram showing the relationship between FIGS. 9A and 9B;

FIGS. 9A and 9 B are functional block diagrams illustrating a configuration of a driving signal selection unit and a peripheral thereof;

DESCRIPTION OF THE EMBODIMENTS

Figure 1:
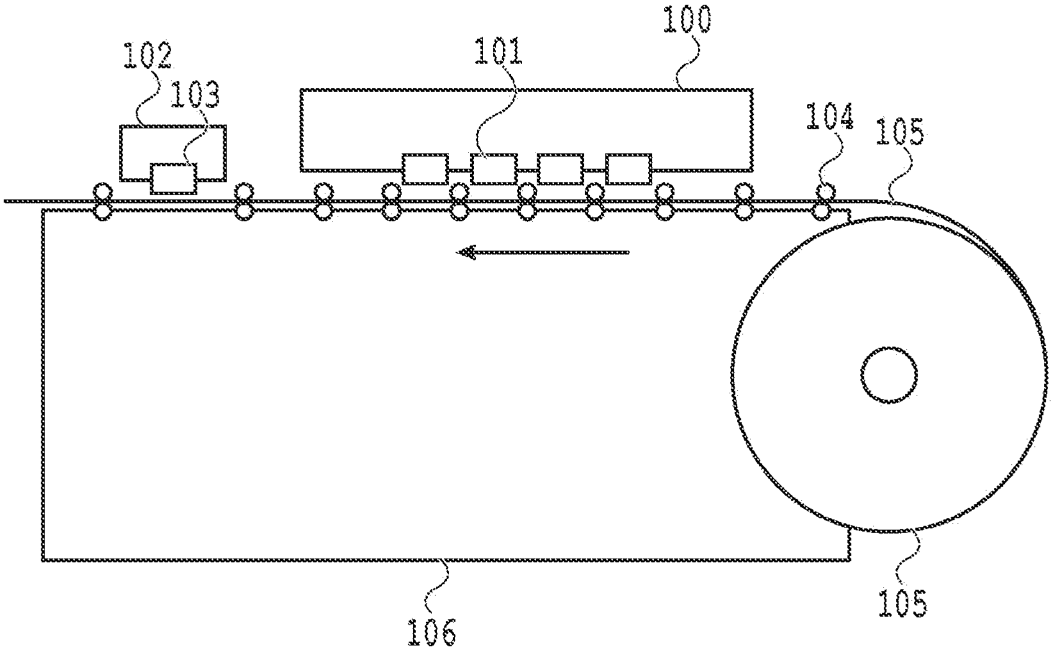
FIG. 1 is a diagram illustrating an overall configuration of an ink jet printing apparatus.

Embodiments of the present disclosure are described below with reference to the drawings. Note that, similar parts are assigned with the same reference numerals, and duplicated descriptions are omitted.

<Overall Configuration of Ink Jet Printing Apparatus>

FIG. 1 is a cross-sectional side view illustrating a configuration of a printing apparatus that is an example of an ink jet type printing apparatus and performs printing on a rolled printing medium such as roll paper by using a full line ink jet printing head.

The full line ink jet printing head (hereinafter, simply referred to as an "ink jet printing head") is a printing head having a printing width equal to or greater than a length of the roll paper in a width direction. Substantially, as illustrated in FIG. 1, the printing apparatus includes a housing 106, a head unit 100, first to fourth ink jet printing heads 101 corresponding to four colors of CMYK, for example, a scanner unit 102, a line scanner 103, and a conveyance roller 104. Additionally, roll paper 105 used as the printing medium is nipped by a pair of conveyance rollers 104 and conveyed in an arrow direction, and an image, a character, and so on are sequentially printed immediately below each of the first to fourth ink jet printing heads 101.

<Configuration of Ink Jet Printing Head>

There has been known a method of generating a pressure in a pressure chamber by using a piezoelectric element as a driving element that ejects ink from a nozzle of each ink jet printing head 101 and ejecting a liquid in the pressure chamber with the pressure from the nozzle formed at one end of the pressure chamber. In such an ink jet printing head, each piezoelectric element includes an electric contact. The electric contact is connected with an integrated circuit that generates the driving signal. The ink is ejected by driving the piezoelectric element by the driving signal. Note that, an element other than the piezoelectric element may be used as the driving element.

Figure 2:
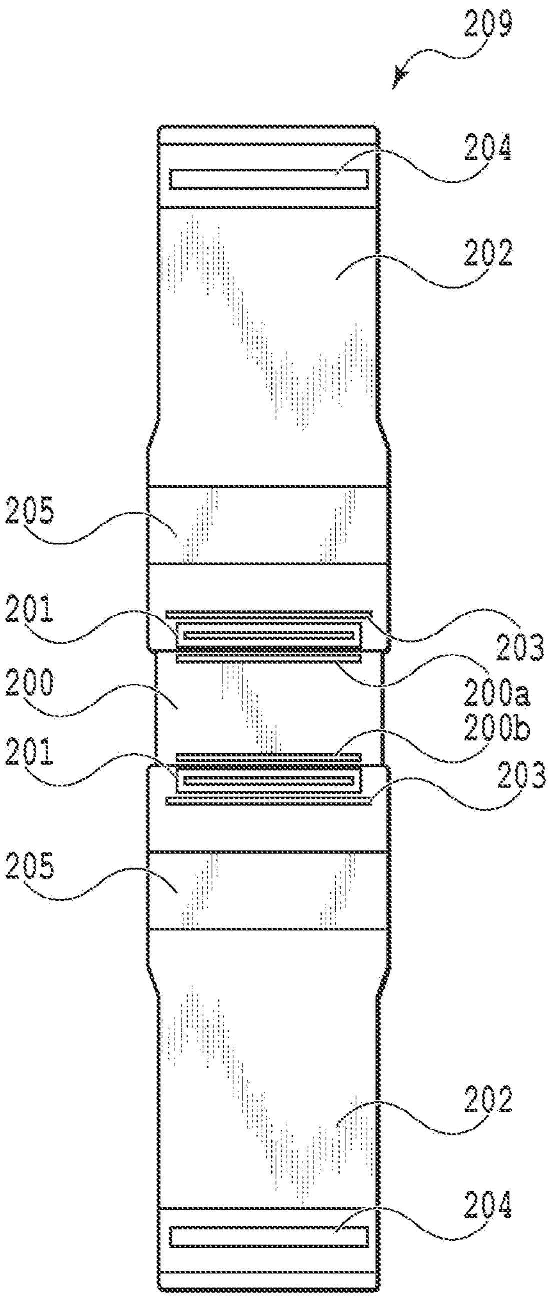
FIG. 2 is a schematic view illustrating a chip unit of an ink jet printing head.

FIG. 2 is a schematic view of a chip unit 209, which is a combination of a driving element substrate 200, two driving signal selection units 201, and two flexible electric wiring substrates 202. The driving element substrate 200 includes a first terminal 200*a* and a second terminal 200*b*. The first terminal 200*a* is electrically connected with a not-illustrated driving element substrate side terminal provided to a first electronic part mounted on a first flexible electric wiring substrate 202. Likewise, the second terminal 200*b* is electrically connected with a not-illustrated driving element substrate side terminal provided to a second electronic part mounted on a second flexible electric wiring substrate 202. In this case, both the first electronic part and second electronic part function as a second driving signal selection unit 201 described later, and in the descriptions below, the first electronic part and second electronic part are assumed to be the driving signal selection unit 201. The first flexible electric wiring substrate 202 includes a selection unit side terminal 203 and is electrically connected with a not-illustrated wiring substrate side terminal provided to a first driving signal selection unit 201. Likewise, the second flexible electric wiring substrate 202 includes the selection unit side terminal 203 and is electrically connected with a not-illustrated wiring substrate side terminal provided to the second driving signal selection unit 201.

Figure 3:
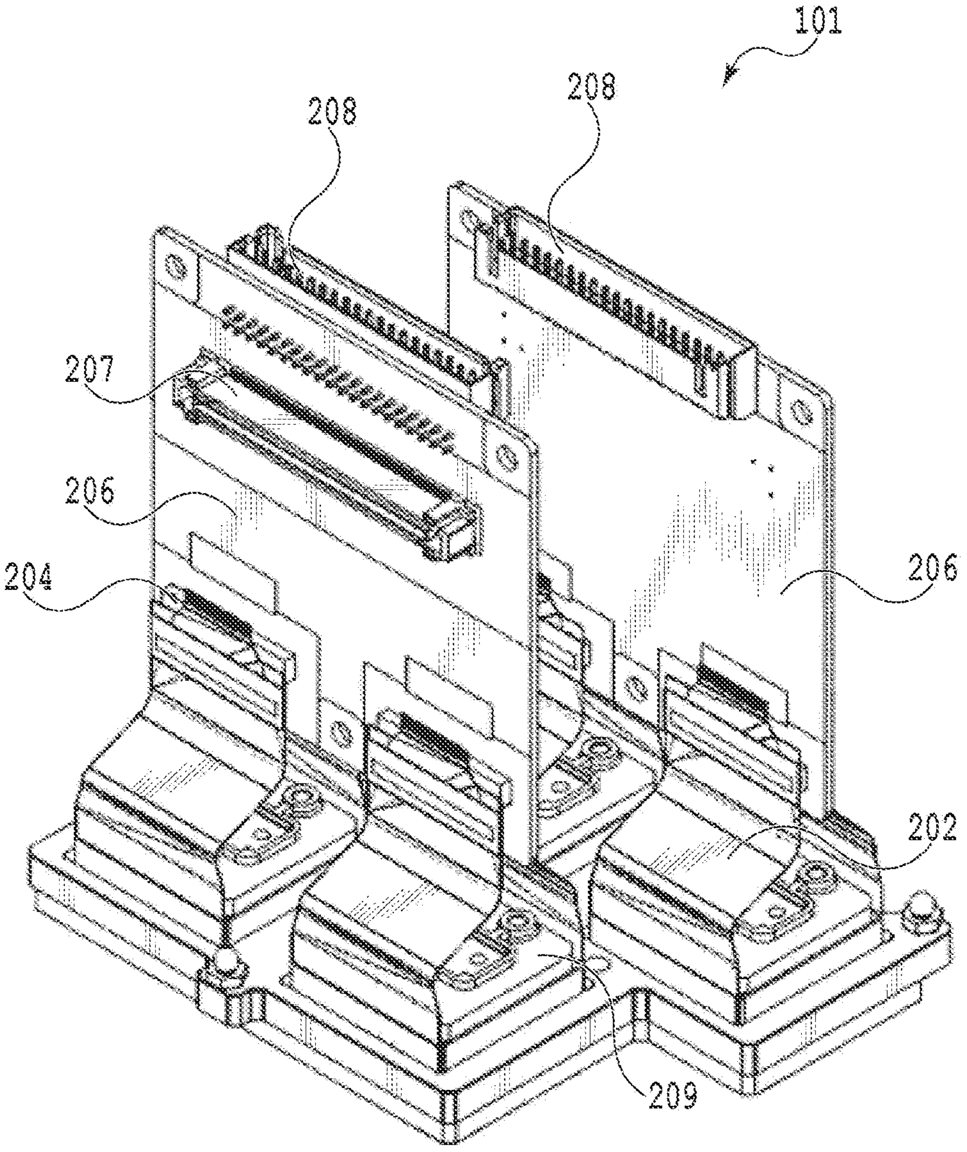
FIG. 3 is a perspective view illustrating the ink jet printing head.
Figure 15A:
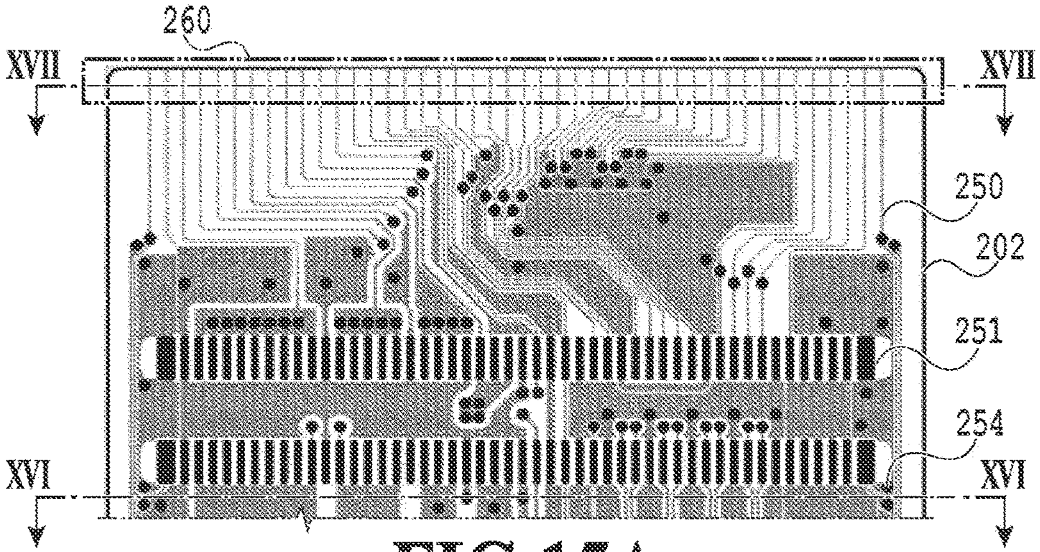
FIGS. 15A, 15B, and 15C are plan views each illustrating a part of the flexible electric wiring substrate according to a first embodiment.
Figure 15B:
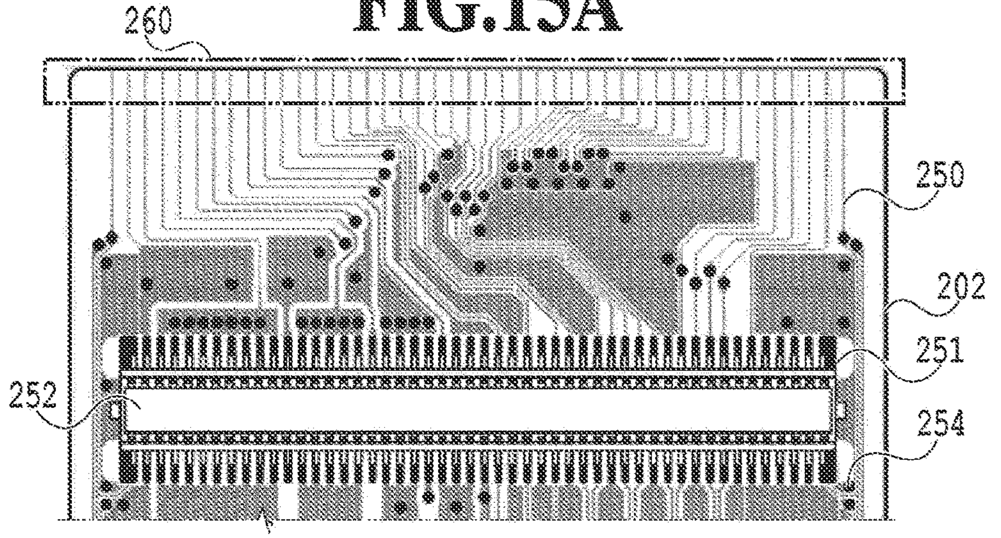

Each flexible electric wiring substrate 202 includes a capacitor implementing unit 205 implementing a power source bypass capacitor of the driving signal selection unit 201 and a head substrate connection unit 204 for the connection to a head substrate 206 (see FIG. 3). As described later, in the head substrate connection unit 204, connector lands 251 (see FIG. 15A) are arranged, and terminals of a connector 252 are connected to the connector lands 251 (FIG. 15B).

FIG. 3 is a perspective view of the ink jet printing head 101. The ink jet printing head 101 includes two head substrates 206 and four chip units 209. Two chip units 209 are connected to each head substrate 206. The electric connection between each chip unit 209 and each head substrate 206 is performed by two connection units 204. Each head substrate 206 includes a signal connection unit 207 and a driving signal connection unit 208 connected with a printing apparatus main body.

Figure 4:
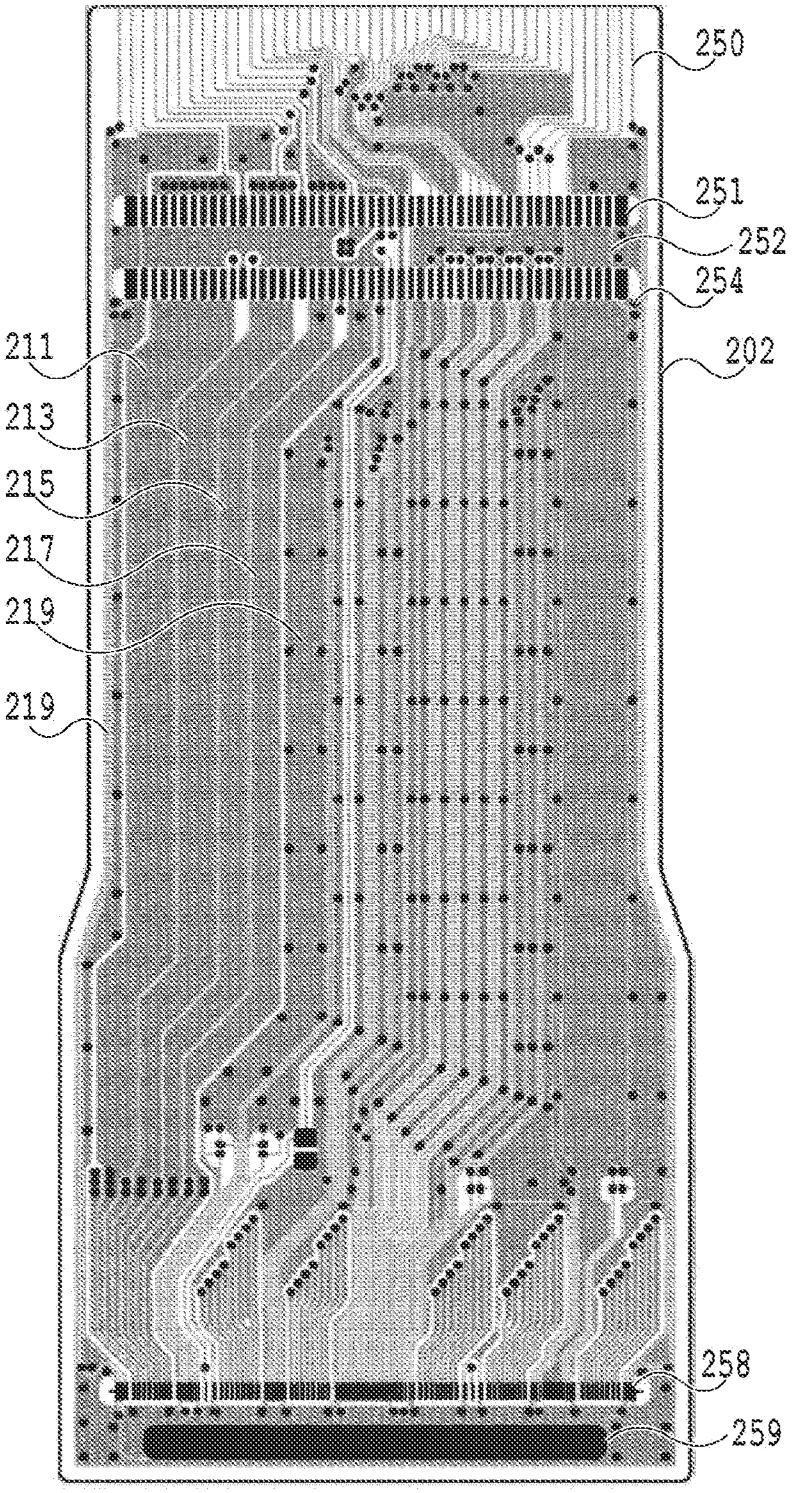
FIG. 4 is a plan view illustrating a first surface of a flexible electric wiring substrate included in the chip unit of the ink jet printing head.

FIG. 4 illustrates wiring of a first surface of the flexible electric wiring substrate 202. A first driving signal line 211, a third driving signal line 213, a fifth driving signal line 215, and a seventh driving signal line 217 are wiring having substantially the same wiring width. A driving signal feedback current line 219 is arranged on the opposite side of the first driving signal line 211 from a side adjacent to the third driving signal line 213. Another driving signal feedback current line 219 is also arranged on the opposite side of the seventh driving signal line 217 from a side adjacent to the fifth driving signal line 215.

In one end portion on the opposite side of a side including plating leads 250 on the flexible electric wiring substrate 202 in a longitudinal direction, multiple wire bonding pads 258 and an implementing unit 259 of the driving signal selection unit 201 are disposed. The driving signal selection unit 201 is implemented in the implementing unit 259, and each terminal of the driving signal selection unit 201 is connected to each wire bonding pad 258 through wiring (not illustrated).

Figure 5:
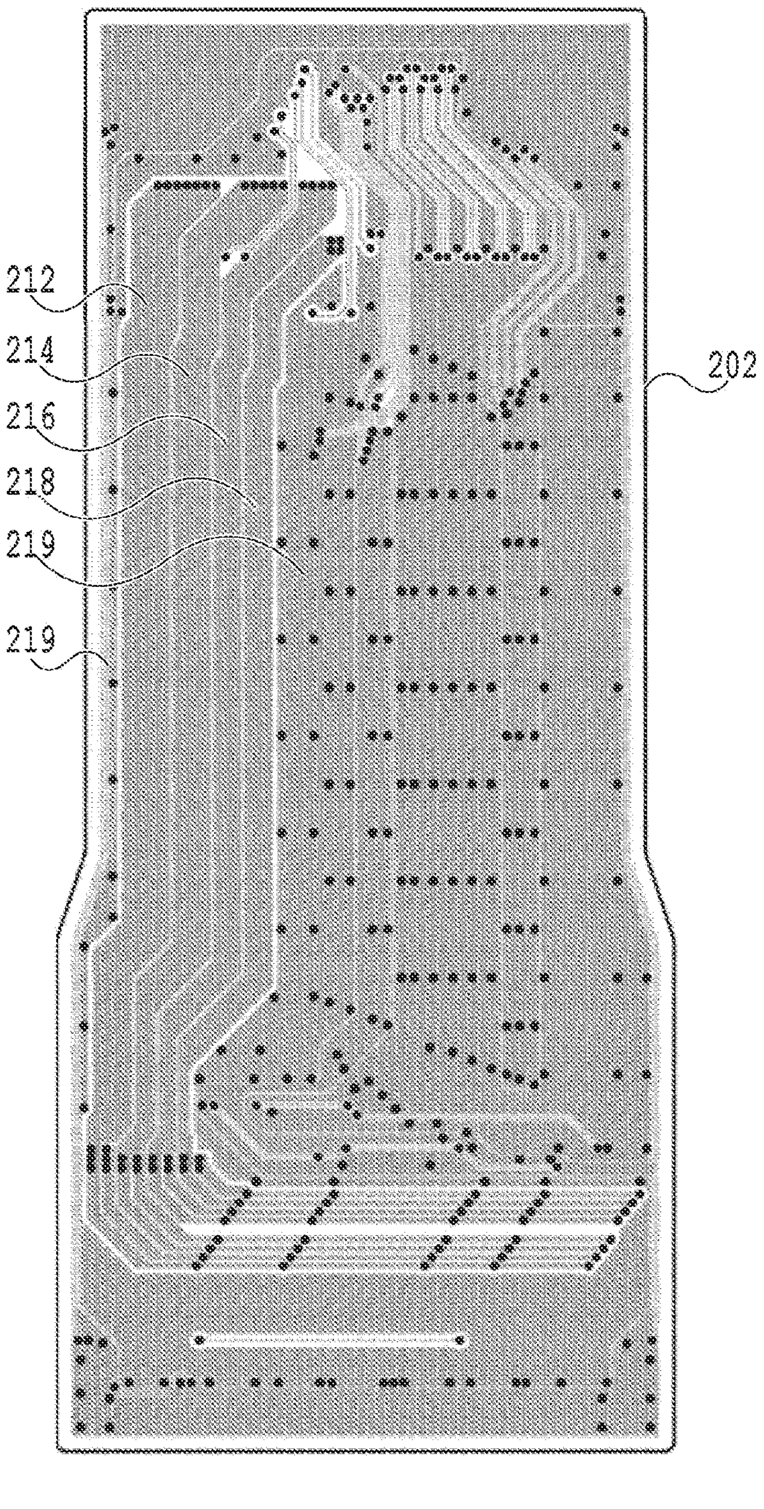
FIG. 5 is a plan view illustrating a second surface of the flexible electric wiring substrate included in the chip unit of the ink jet printing head.

FIG. 5 illustrates wiring of a second surface of the flexible electric wiring substrate 202. A second driving signal line 212, a fourth driving signal line 214, a sixth driving signal line 216, and an eighth driving signal line 218 are wiring having substantially the same wiring width. Further driving signal feedback current line 219 is arranged on the opposite side of the second driving signal line 212 from a side adjacent to the fourth driving signal line 214. Further driving signal feedback current line 219 is also arranged on the opposite side of the eighth driving signal line 218 from a side adjacent to the sixth driving signal line 216.

<Descriptions of Method of Driving Piezoelectric Element and Driving Signal of Piezoelectric Element>

Figure 6A:
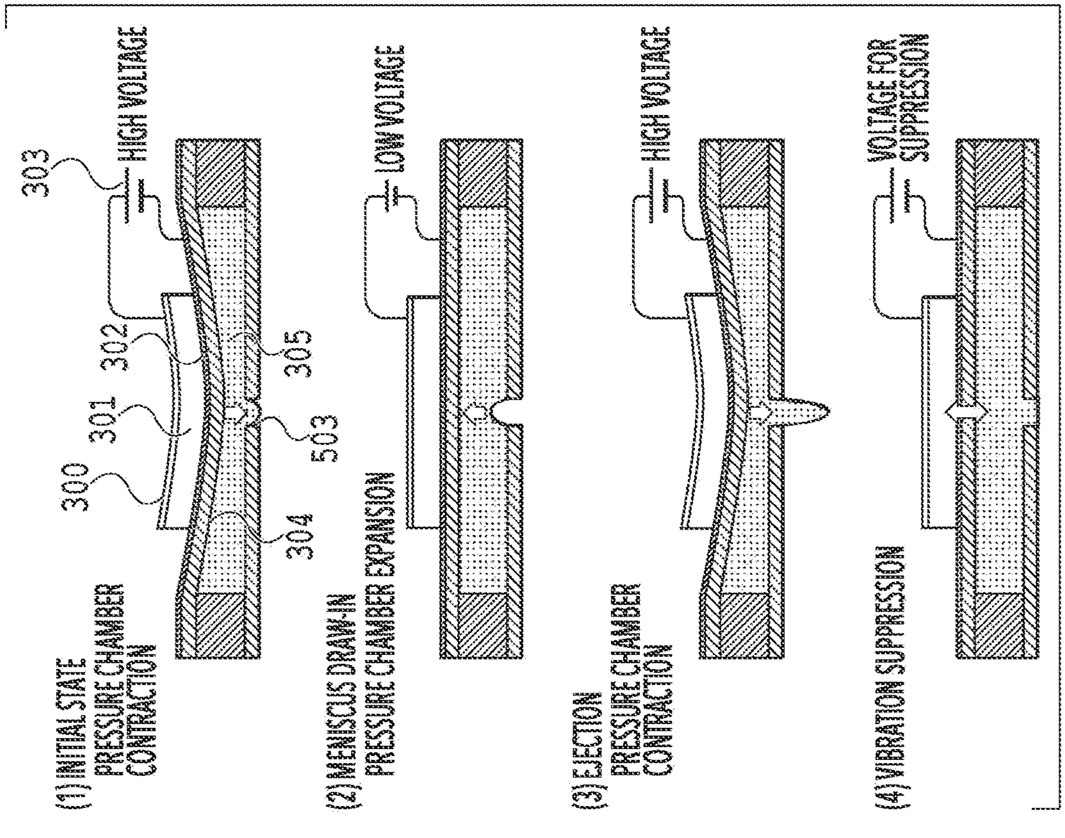
FIG. 6A is a diagram illustrating a method of driving a piezoelectric element.
Figure 6B:
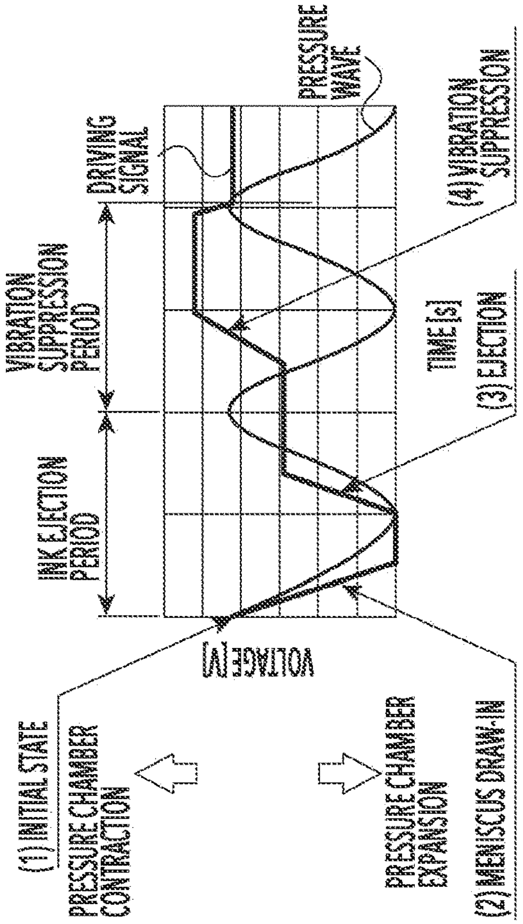
FIG. 6B is a diagram illustrating a driving signal of the piezoelectric element.

A method of driving a piezoelectric element 301 and a driving signal applied to the piezoelectric element 301 are described with reference to FIGS. 6A and 6B. The method of driving the piezoelectric element 301 includes the following steps (1) to (4). These steps are described sequentially.

(1) In the initial state, a pressure chamber 304 is filled with ink 305, a high voltage is applied between an upper electrode 300 and a lower electrode 302 of the piezoelectric element 301 by voltage source 303, and the pressure chamber 304 is contracted.

(2) The pressure chamber 304 is expanded by reducing the voltage of the voltage source 303 to draw the ink 305 therein. In this process, a sinusoidal pressure wave is generated by the piezoelectric element 301 in the pressure chamber 304.

(3) The voltage of the voltage source 303 is increased in synchronization with the pressure wave generated in (2) described above to contract the pressure chamber 304, and the ink 305 is ejected.

(4) After (3) described above, the piezoelectric element 301 continues machinery vibration. In order to cancel out the machinery vibration and stop the piezoelectric element 301, the voltage of the voltage source 303 is increased again.

The above-described steps (1) to (4) are a single ejection operation, and a sequence of the changes of the voltage of the voltage source 303 described above is the waveform of the driving signal that should be applied to the piezoelectric element 301.

<Electric Configuration of Ink Jet Printing Apparatus>

Figure 7:
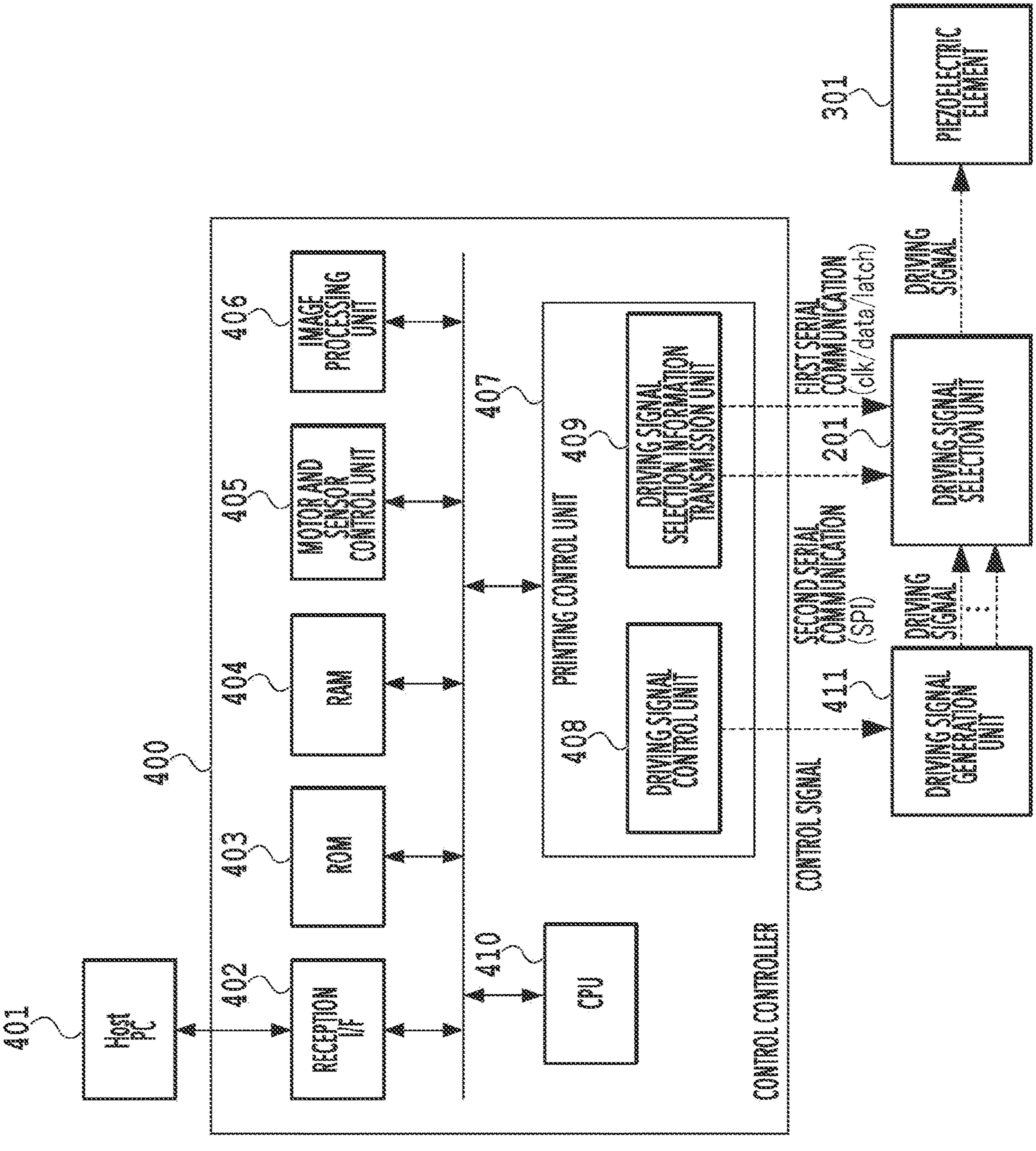
FIG. 7 is a functional block diagram illustrating an electric configuration of the ink jet printing apparatus.

An electric configuration of the ink jet printing apparatus is described. FIG. 7 is a functional block diagram illustrating the electric configuration of the ink jet printing apparatus. A Host PC 401 transmits a printing instruction and printing data to a control controller 400.

The control controller 400 that controls the ink jet printing apparatus includes a reception I/F 402 communicating with the Host PC 401, a CPU 410, and a ROM 403 storing a program to operate the CPU 410. Additionally, the control controller 400 also includes a RAM 404 that temporarily stores a program to be executed by the CPU 410 and various data and a motor and sensor control unit 405 that controls a motor and a sensor in the ink jet printing apparatus. Moreover, the control controller 400 also includes an image processing unit 406 that performs image processing on the printing data transmitted from the Host PC 401 through the reception I/F 402 and a printing control unit 407 that controls the printing head based on the data processed by the image processing unit 406. The image processing unit 406, by using the printing data received from the Host PC 401, generates raster image data which can be subjected to the printing processing, converts the raster image data into image data of each ink color, such as CMYK, which can be processed by the printing control unit 407, and outputs the image data.

The printing control unit 407 includes a driving signal control unit 408 and a driving signal selection information transmission unit 409. The driving signal control unit 408 transmits a control signal to generate the driving signal to a driving signal generation unit 411. The driving signal selection information transmission unit 409 transmits driving signal selection information to the driving signal selection unit 201 through serial communication.

The driving signal generation unit 411 outputs multiple driving signals to the driving signal selection unit 201 based on the control signal transmitted from the driving signal control unit 408.

The driving signal selection unit 201 selects driving signals designated by the driving signal selection information transmitted from the driving signal selection information transmission unit 409 from the multiple driving signals inputted from the driving signal generation unit 411 and outputs the selected driving signals to the piezoelectric elements 301 corresponding to the nozzles in the printing head unit. Once the voltage of the driving signal waveform is applied to the two electrodes of the piezoelectric element 301, the piezoelectric element 301 between the two electrodes is displaced, and with the ejection energy generated accordingly, the ink is ejected from the nozzle. Accordingly, the piezoelectric element 301 may be referred to as an ejection energy generation element.

First serial communication between the driving signal selection information transmission unit 409 and the driving signal selection unit 201 is established by a clk signal, a data signal, and a latch signal. The information is communicated using the data signal in synchronization with the clk signal, and the information is synchronized in units of the latch signal.

Second serial communication between the driving signal selection information transmission unit 409 and the driving signal selection unit 201 is used to perform setting inside the driving signal selection unit 201. A wide-spread well-known communication protocol such as Serial Peripheral Interface (SPI) is used; however, the communication method is not limited thereto.

The printing head 101 includes a nozzle unit 503 having a mechanism to eject the ink and the piezoelectric element 301 (see FIG. 6A) corresponding to the nozzle unit 503. The nozzle unit 503 ejects the ink in response to the driving signal supplied to the piezoelectric element 301 corresponds to the nozzle unit 503 from the driving signal selection unit 201. The printing head 101 herein includes 128 nozzle units 503 and 128 piezoelectric elements 301 corresponding to the nozzle units 503, respectively. Note that, the number is merely an example, and the present disclosure is not limited thereto.

Figure 8:
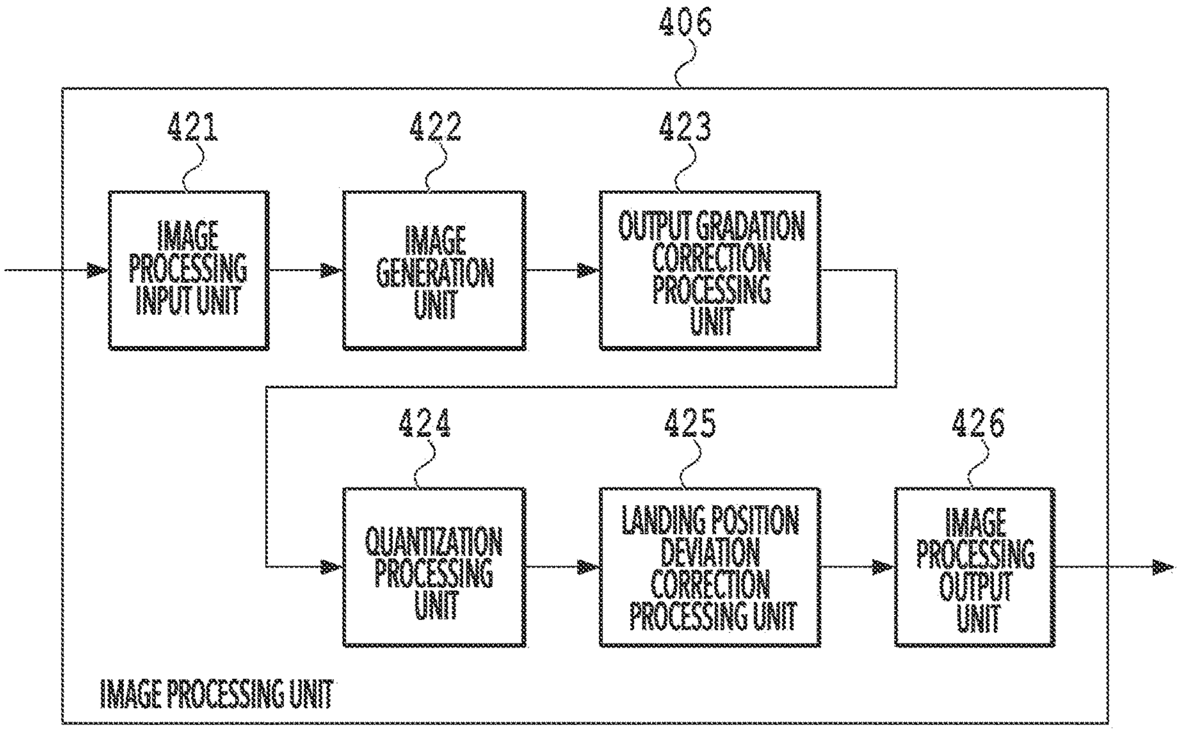
FIG. 8 is a functional block diagram illustrating a configuration example of an image processing unit.

FIG. 8 is a diagram illustrating details of the image processing unit 406 in FIG. 7. An image processing input unit 421 inputs the printing data and transfers the printing data to an image generation unit 422. The image generation unit 422 converts the printing data into CMYK data having a resolution that enables printing by the printing head and outputs the CMYK data. An output gradation correction processing unit 423 performs correction processing corresponding to the ink output characteristic. A quantization processing unit 424 performs processing to convert input data having gradation represented by 8 bit to 16 bit into data having N gradation which conforms with the ink ejected by the nozzle unit 503 of the printing head 101. In the data conversion processing, input data having gradation represented by 8 bit to 16 bit is converted into data having N gradation using a general method such as an error diffusion method and a dithering method. In this case, for example, any one of values 1 to 4 is applied to N. A landing position deviation correction processing unit 425 deviates the data in units of pixel so as to correct the landing position deviation in units of resolution of the image for each nozzle. An image processing output unit 426 performs processing to output the resultant image data on which the image processing have been applied.

<Description of Driving Signal Selection Unit>

The driving signal selection unit 201 is described with reference to FIG. 9. The data transmitted from the driving signal selection information transmission unit 409 through the first serial communication (clk/data/latch) is received by a serial-parallel conversion unit 506, synchronized with the latch signal, and held by a data latch 507. The held driving signal selection information is inputted to a decoder 509.

Additionally, the driving signal generation unit 411 includes multiple digital-analog conversion units 512 and multiple driving signal generation circuits 513. Each digital-analog conversion unit 512 outputs an analog signal having a level according to the control signal inputted from the driving signal control unit 408. Each driving signal generation circuit 513 generates the driving signal by amplifying the analog signal inputted from the digital-analog conversion unit 512.

The generated driving signal is inputted to switch groups 510 in the driving signal selection unit 201 implemented on the flexible electric wiring substrate 202 through the head substrate 206 (see FIG. 3) and the flexible electric wiring substrate 202 (see FIG. 3).

Figures 9, 9A:
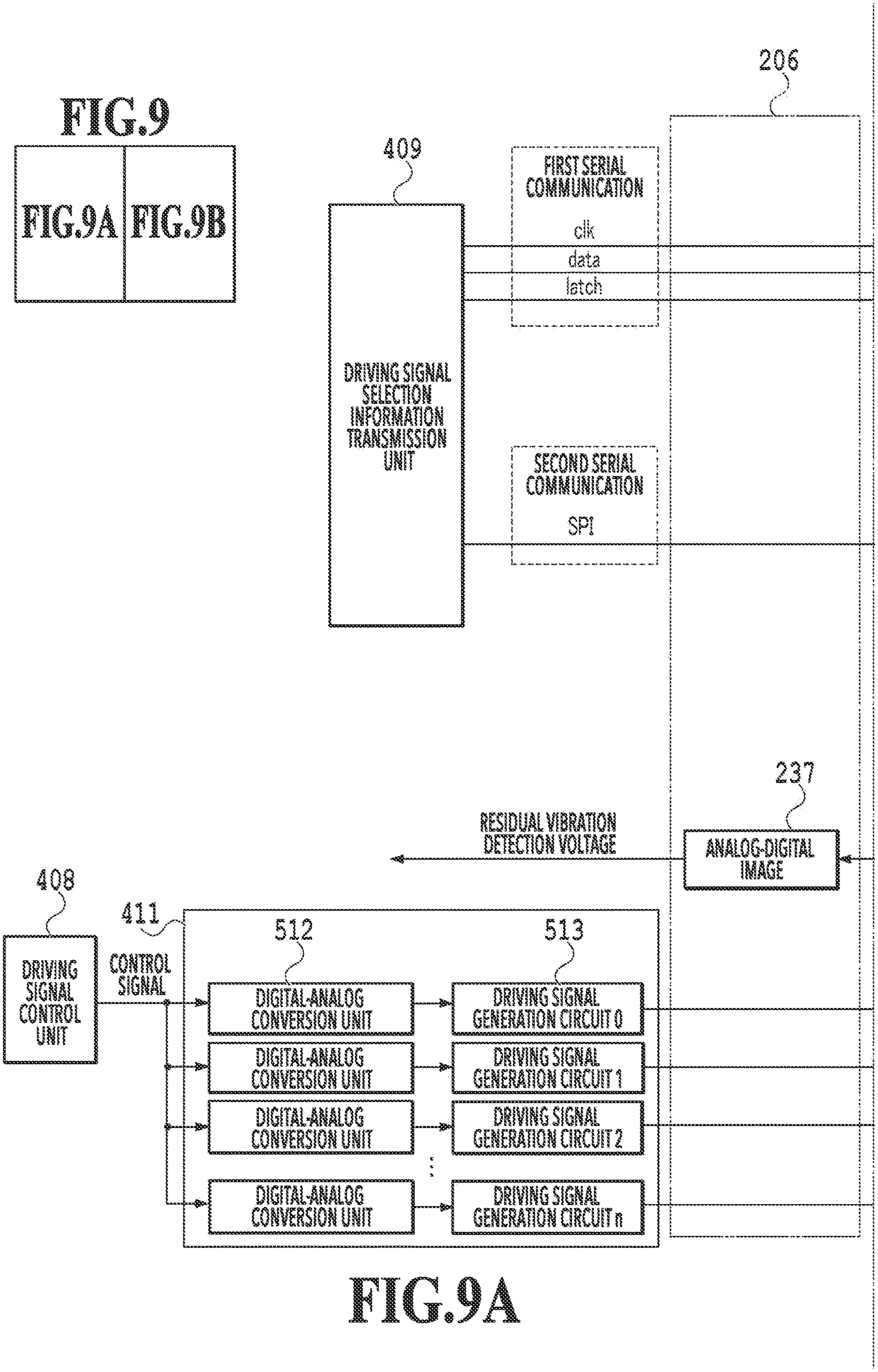
Figure 9B:
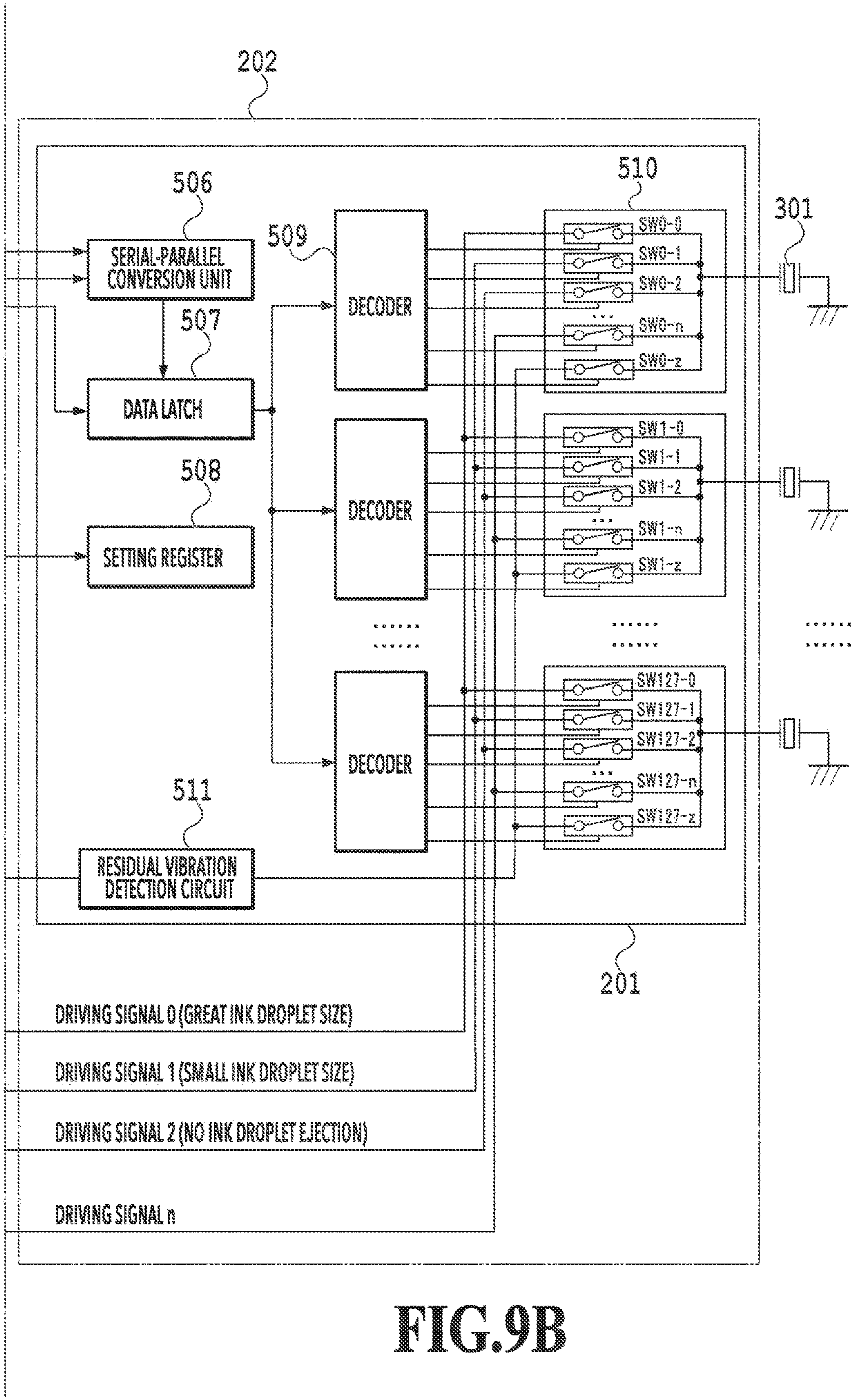

As illustrated in FIG. 9, each switch group 510 includes multiple switches SWx-y. In this case, x is a nozzle number, and y is a driving signal number. The multiple switches SWx-y operate based on decode information outputted by the decoder 509. Thus, with a synthesized driving signal obtained by synthesizing the driving signals selected from the multiple driving signals based on the decode information, it is possible to drive the piezoelectric element 301 selected based on the decode information. In the present embodiment, the printing head 101 includes the 128 nozzle units 503 and the 128 piezoelectric elements 301 corresponding to the nozzle units 503, respectively. Additionally, there are the same number of the decoders 509 and the switch groups 510 as the number of the nozzle units 503. Note that, the numbers are merely an example, and the present disclosure is not limited thereto.

<Description of Serial Communication>

Figure 10:
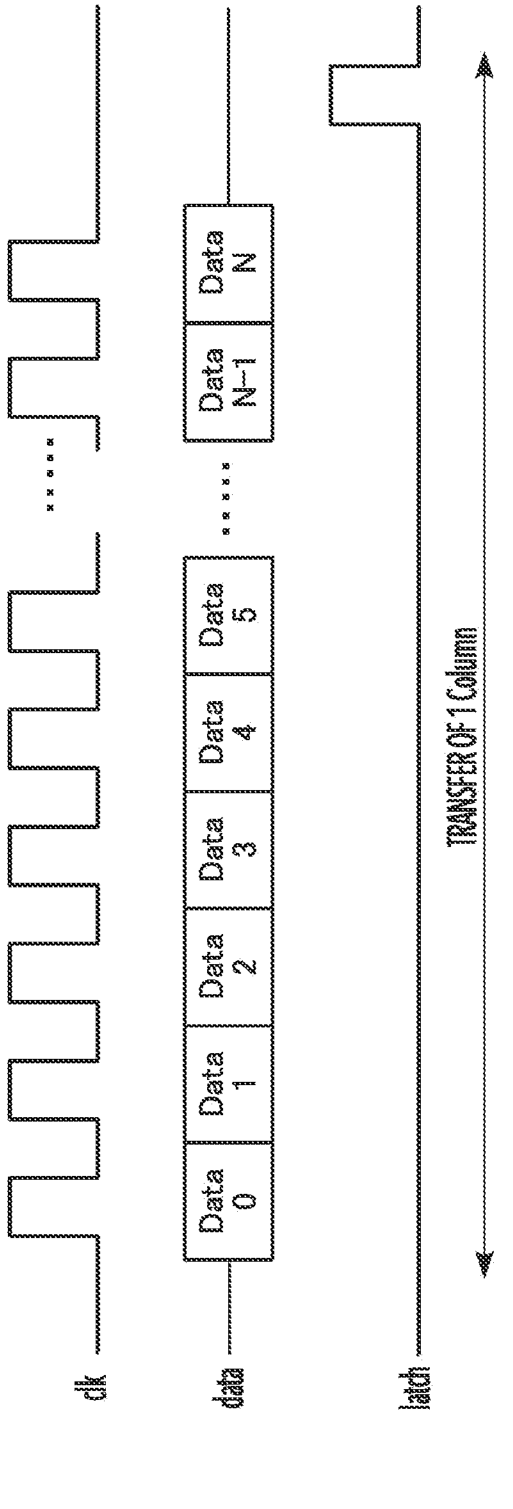
FIG. 10 is a timing chart illustrating serial communication.

FIG. 10 illustrates the signal of the serial communication outputted from the driving signal selection information transmission unit 409 (FIGS. 7 and 9).

The data signal is transmitted in synchronization with the clk signal, and the latch signal indicates the end of the transmission of a group of data signals that should be subjected to the serial-parallel conversion concurrently.

The data signal is not necessarily single, and the number of the data signals may be increased taking into consideration the balance between the clk signal and the frequency so as to be in accordance with the ink ejection frequency. In the present embodiment, the communication is established such that data of one column, that is, data of "the number of the nozzle units" multiplied by "a bit number of a driving signal selection signal", is transmitted for each latch signal. In this case, the driving signal selection signal is a signal inputted to each decoder 509. An x-th decoder 509 generates a signal to control the corresponding switch SWx-y by decoding the driving signal selection signal. For example, there are driving signal 0 to driving signal 3 as the driving signals (in other words, there are four types of driving signals), and in a case where the number of the nozzles is 128, the number of bits of the driving signal selection signal is 2; therefore, 128×2=256 pieces of data are transmitted for each latch signal. Note that, in a case there is a residual vibration detection switch as described later, there are five types of signals that should be selected (=four types+one type); therefore, the number of bits of the driving signal selection signal is 3, and 128×3=384 pieces of data are transmitted for each latch signal.

<Driving Signal Selection Unit Timing Chart>

Figure 11:
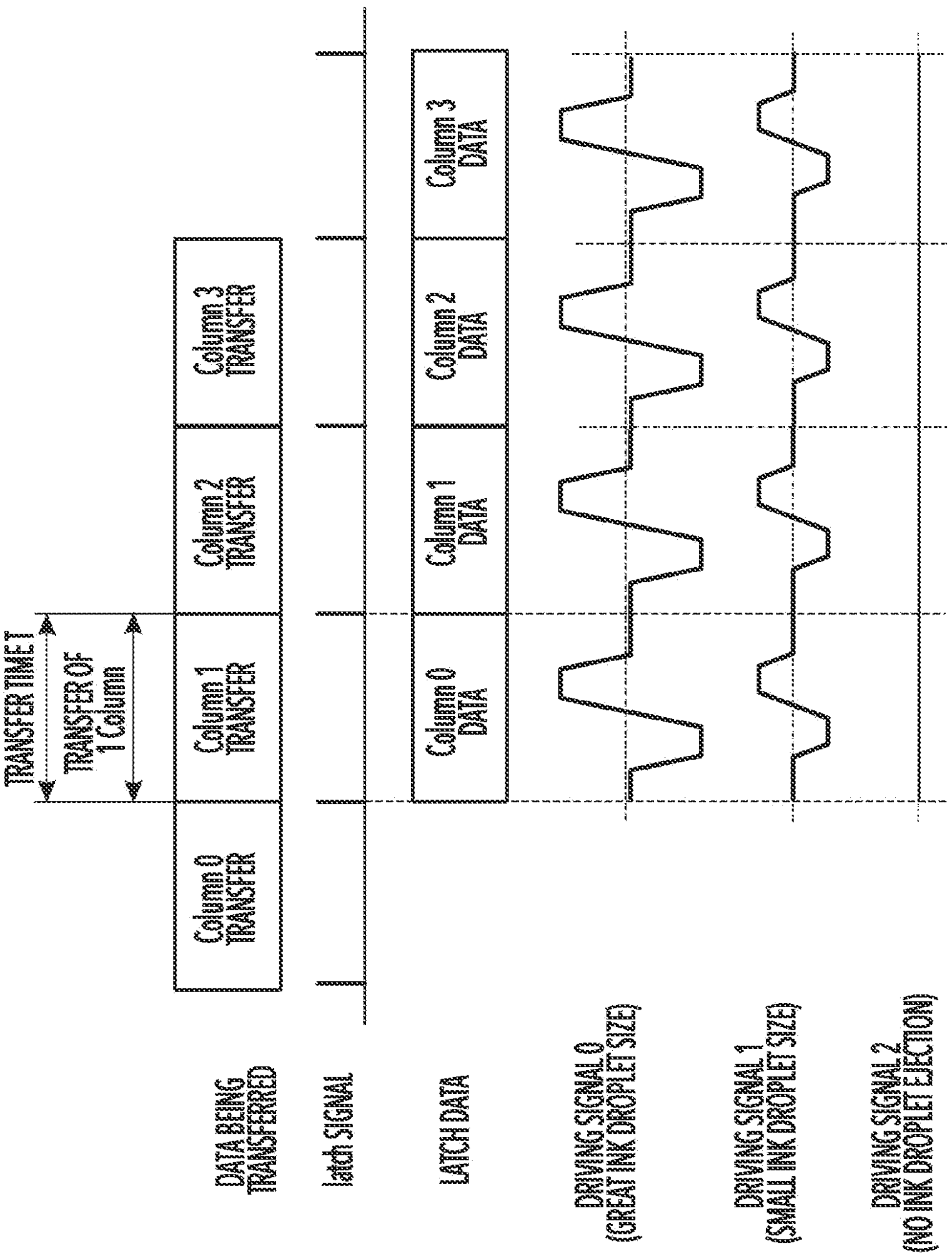
FIG. 11 is a timing chart illustrating an operation of the driving signal selection unit.

FIG. 11 illustrates a relationship between the data of the serial communication and the driving signal. Between two adjacent latch signals, data of one Column i.e., S pieces of data, where S is the number obtained by multiplying the number of the nozzle units by the number of bits of the driving signal selection signal, is transferred, and the received data is held by the data latch 507 in FIG. 9 based on the latch signal which represents a starting point. As an example, for each nozzle unit 503, the synthesized driving signal, which is obtained by synthesizing the driving signals selected from the four driving signals (driving signal 0 to driving signal 3) based on the 2 bit of the driving signal selection signal being held, is supplied to the piezoelectric element 301 corresponding to the nozzle unit 503. The driving signals (driving signal 0 to driving signal 3) that can implement a desired ink droplet state, such as a great ink droplet size, a middle ink droplet size, a small ink droplet size, and no ink droplet ejection, are respectively allocated to, and used for, the four driving signal generation circuits 513.

<Description of Residual Vibration Detection Circuit>

Switches SWx-0 to SWx-n of the switches SWx-y included in the switch group 510 in FIG. 9 are switches that each apply the driving signal to the piezoelectric element 301 corresponding to the nozzle unit 503. On the other hand, a switch SWx-z is a switch that supplies a residual vibration voltage to a residual vibration detection circuit 511, where the residual vibration voltage is generated in the piezoelectric element 301 due to a residual vibration after the piezoelectric element 301 is driven.

Figure 12:
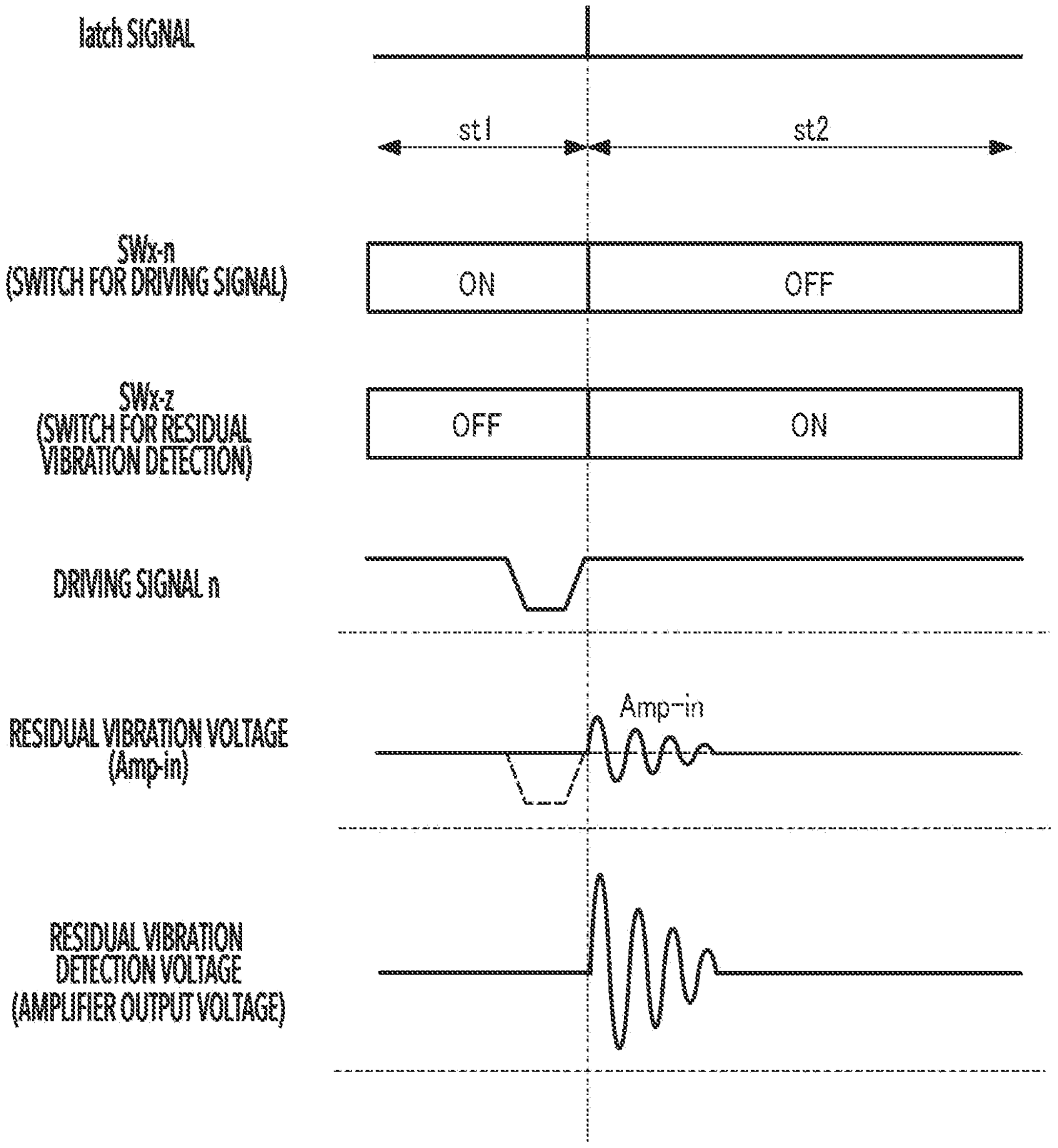
FIG. 12 is a waveform chart illustrating a residual vibration voltage.

As illustrated in FIG. 12, in a period st1, the driving signal is applied to the piezoelectric element 301 to drive the piezoelectric element 301. Once the driving the piezoelectric element 301 by the driving signal ends at the end of the period st1, in a subsequent period st2, a vibration voltage Amp-in as illustrated in FIG. 12 is generated in the piezoelectric element 301. The vibration voltage Amp-in is generated due to that a residual machinery vibration in the piezoelectric element 301 is converted into the voltage by the piezoelectric effect, and is called the residual vibration voltage. It is possible to detect an abnormality of each nozzle by detecting and analyzing the residual vibration voltage.

Figure 13:
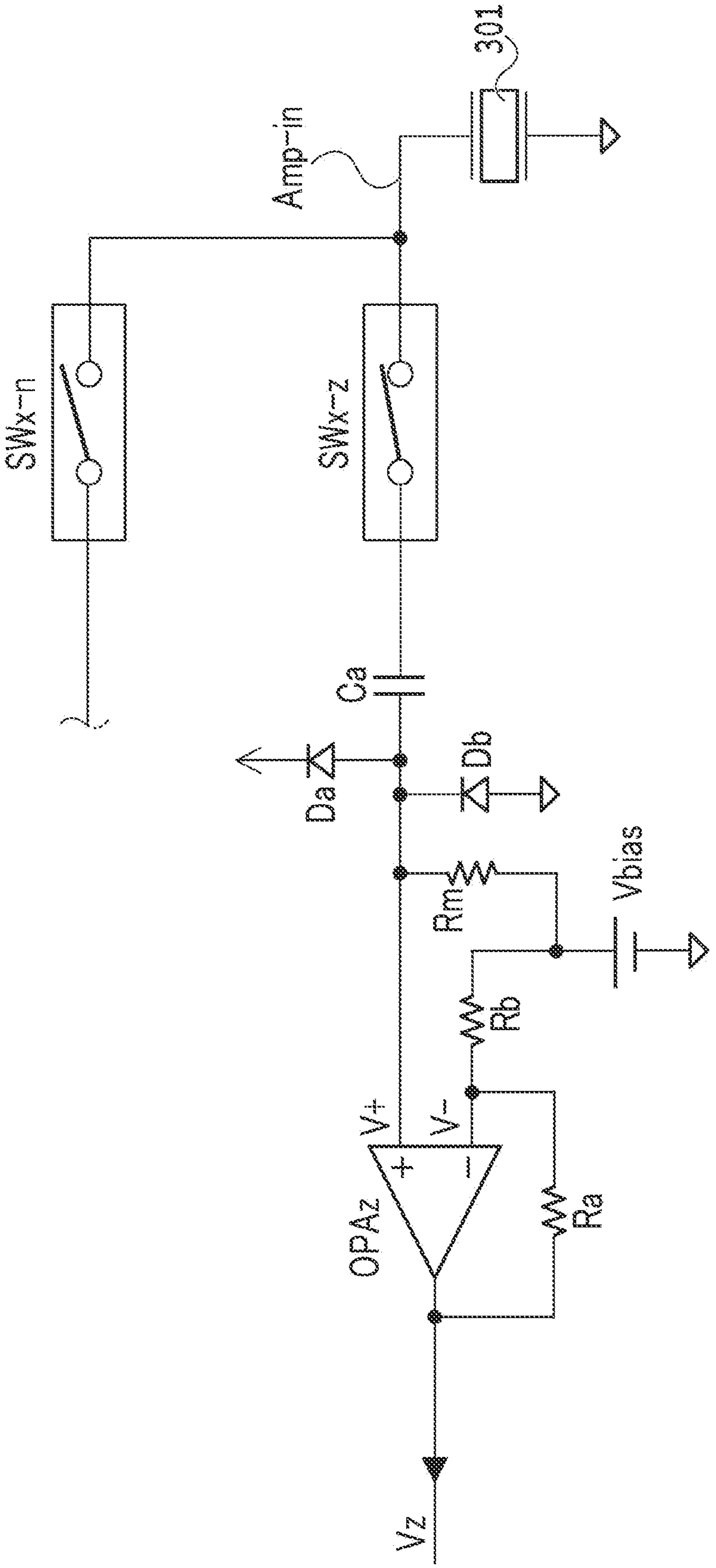
FIG. 13 is a circuit diagram illustrating a configuration of a residual vibration voltage detection circuit.

A configuration example of the residual vibration detection circuit 511 illustrated in FIG. 9 is illustrated in FIG. 13. The residual vibration voltage Amp-in is supplied to a non-inverting input terminal V+ of an operational amplifier OPAz through the switch SWx-z, and a capacitor Ca. Additionally, the non-inverting input terminal V+ of the operational amplifier OPAz is connected to a bias voltage Vbias through a resistor Rm. On the other hand, an inverting input terminal V− of the operational amplifier OPAz is connected to the bias voltage Vbias through a resistor Rb. Additionally, the inverting input terminal V− of the operational amplifier OPAz is connected to an output terminal of the operational amplifier OPAz through a resistor Ra. With the above-described configuration, the residual vibration detection circuit 511 amplifies the residual vibration voltage Amp-in and outputs the voltage after the amplification as a residual vibration detection voltage Vz. The residual vibration detection voltage Vz after the amplification is expressed by the following equation.

$$Vz = \frac{R_a + R_b}{R_b} \cdot Amp_{-in} + V_{bias}$$

The residual vibration detection voltage Vz after the amplification is transmitted to the outside of the residual vibration detection circuit 511.

Thereafter, the residual vibration detection voltage Vz after the amplification is converted into a digital signal by a not-illustrated analog-digital conversion device and is analyzed by a not-illustrated logic circuit and the CPU 410.

<Description of Driving Signal Generation Circuit>

Figure 14:
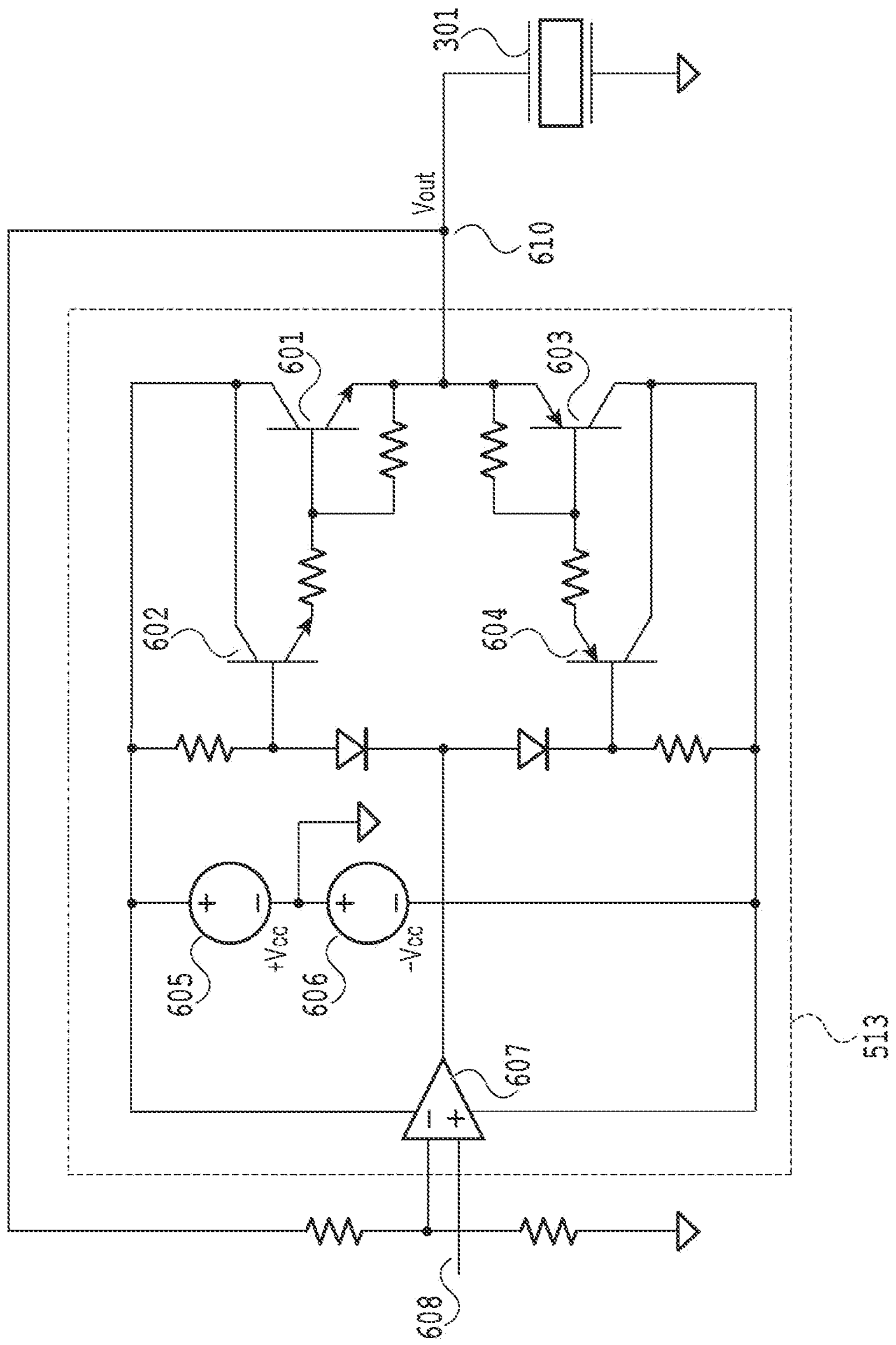
FIG. 14 is a circuit diagram illustrating an example of an amplifier circuit that generates a driving signal for ink ejection.

A configuration example of the driving signal generation circuit 513 illustrated in FIG. 9 is illustrated in FIG. 14. The driving signal generation circuit 513 includes a so-called operational amplifier circuit 607, and the driving signal generation circuit 513 amplifies a voltage and a current of an analog signal 608 supplied to a non-inverting input terminal of the operational amplifier 607. In addition to the operational amplifier 607, the driving signal generation circuit 513 includes transistors 601 and 602 that are Darlington-connected on a high side and transistors 603 and 604 that are Darlington-connected on a low side. The transistors 601 and 602 are npn transistors, and the transistors 603 and 604 are pnp transistors. Base terminals of the transistors 602 and 604 are connected to an output terminal of the operational amplifier 607 through respective diodes, and emitter terminals of the transistors 601 and 603 are connected to the piezoelectric element 301 through the not-illustrated switch SWx-n. Voltages of the emitter terminals of the transistors 601 and 603 are resistively divided and fed back to an inverting input terminal of the operational amplifier 607.

In the above configuration, once the analog signal 608 is inputted to the driving signal generation circuit 513, the voltage of the analog signal 608 is amplified by the operational amplifier 607. Next, the transistors 601 and 602 and the transistors 603 and 604 amplify the current. The piezoelectric element 301 is driven by a driving signal 610 of which both the voltage and current are amplified, and the ink is ejected.

First Embodiment

In the flexible electric wiring substrate 202 illustrated in FIG. 2, the driving signal selection unit 201 that drives the piezoelectric element 301 mounted on the driving element substrate 200 is implemented. Additionally, in the head substrate connection unit 204 of the flexible electric wiring substrate 202, the connector 252 (see FIG. 15B) that connects the wiring of the flexible electric wiring substrate 202 and the wiring of the head substrate 206 illustrated in FIG. 3 is also implemented. The connector 252 that connects the wiring of the flexible electric wiring substrate 202 and the wiring of the head substrate 206 is a substrate-to-substrate connector. The wiring in the flexible electric wiring substrate 202 and the terminal of the driving signal selection unit 201 are connected by wire bonding connection. For example, the wire bonding pads 258 for the wire bonding connection on the flexible electric wiring substrate 202 are copper foils on which gold plating processing is performed.

As a method of performing gold plating on copper foil, electrolytic plating and non-electrolytic plating are widely known. The electrolytic plating is a method of plating a target object by flowing a current in a plating solution, and the non-electrolytic plating is a method of plating a target object by using a chemical reaction in a plating solution. The electrolytic plating is characterized by thick plating, and the non-electrolytic plating is characterized by thin and uniform plating.

Since it is favorable for the plating for wire bonding to be thick, the electrolytic plating is often used. In this case, since it is necessary for the electrolytic plating to flow a current to the wiring on which the plating is to be performed, a wiring used as a current supply port, that is, a plating lead, needs to be wired to the wiring on which the plating is to be performed. In a first embodiment of the present embodiment, for example, as illustrated in FIG. 15A, the plating leads 250 are wired on the first surface of the flexible electric wiring substrate 202. Note that, although the plating leads 250 are arranged at equal intervals in the configuration illustrated in FIG. 15A, the plating leads 250 are not necessarily arranged at equal intervals.

FIG. 2 is a schematic view of the chip unit 209. In the electric inspection of the chip unit 209 in a manufacturing process, an inspection device and the chip unit 209 need to be electrically connected. As an example of an electric connection port for the connection, we may use the connector 252 (see FIG. 15B), which is originally used as the substrate-to-substrate connector, implemented on the head substrate connection unit 204 on the flexible electric wiring substrate 202. However, a limitation of the number of times of fitting of the substrate-to-substrate connectors each other is about 50 because of the effect of abrasion and the like. Therefore, there occurs a problem that the connector on an inspection device side needs to be replaced frequently in a case where the connectors are attached to each other and detached from each other in every electric inspection. In order to overcome this problem, inspection probes 255 (see FIG. 17) are used in this embodiment that can be abutted onto the plating leads 250 on the flexible electric wiring substrate 202 on the inspection device side, which allows for the electric connection without fitting the connectors. Hereinafter, the inspection probe 255 is simply referred to as a "probe".

With reference to FIG. 15A, two rows of the connector lands 251 to which the terminals of the connector 252 are connected are provided on the flexible electric wiring substrate 202. The two rows extend in a width direction of the flexible electric wiring substrate 202. A distance from one of the two rows to one end portion, on a side including the plating leads 250, of the flexible electric wiring substrate 202 in the longitudinal direction is longer than a distance from the other of the two row to the one end portion, on the side including the plating leads 250, of the flexible electric wiring substrate 202 in the longitudinal direction. For the inspection using the plating leads 250, it is necessary to provide wirings that respectively connect the plating leads 250 with at least parts of the connector lands 251 in the row close to the one end portion, on the side including the plating leads 250, of the flexible electric wiring substrate 202 in the longitudinal direction. Additionally, it is also necessary to provide wirings that respectively connect the plating leads 250 with at least parts of the connector lands 251 in the row far from the one end portion, on the side including the plating leads 250, of the flexible electric wiring substrate 202 in the longitudinal direction.

Basically, the connector lands 251 that respectively need to be connected with the plating leads 250 are the connector lands 251 that respectively correspond to input or output signals of the driving signal selection unit 201 and at least includes the following connector lands.

- Connector lands respectively corresponding to the first driving signal line 211 (see FIG. 4) to an n-th driving signal line 218 (see FIG. 5) (note that, n is the number of the driving signal lines)
- Connector lands corresponding to signal lines related to the first serial communication (see FIG. 9) (connector lands respectively corresponding to a signal line of the clk signal, a signal line of the data signal, and a signal line of the latch signal)
- Connector lands corresponding to signal lines related to the second serial communication (see FIG. 9) (connector lands corresponding to signal lines according to the communication protocol such as SPI)

A connector land corresponding to the driving signal feedback current line 219 (see FIG. 9) (a connector land corresponding to a wiring of the residual vibration detection voltage Vz after the amplification)

A connector land corresponding to a power source wiring

A connector land corresponding to a ground wiring

In this case, the driving signal selection signal is generated based signals on the signal lines related to the first serial communication. Then, the signal obtained by synthesizing the driving signals selected based on the driving signal selection signal by the decoder 509 and the switch SWx-y is supplied to the piezoelectric element 301. Accordingly, it can be said that the connector lands corresponding to the signal lines related to the first serial communication are connector lands corresponding to the driving signal selection signal.

Figure 15C:
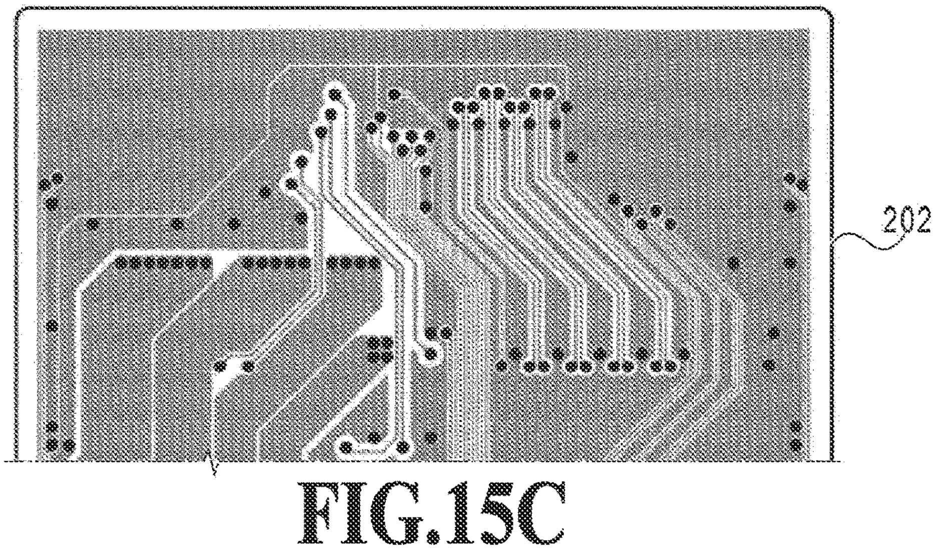

Incidentally, in a case where the flexible electric wiring substrate 202 is a one-sided wiring substrate, a restriction as follows occurs. In order to connect the plating lead 250 with the connector land 251 in the row on the side far from the one end portion, on the side including the plating leads 250, of the flexible electric wiring substrate 202 in the longitudinal direction, wiring as follows is necessary. In other words, a wiring that passes between the connector lands 251 in the row on the side close to the one end portion, on the side including the plating leads 250, of the flexible electric wiring substrate 202 in the longitudinal direction is necessary. However, since a pitch of the connector lands 251 is 0.5 mm or shorter, it is difficult to provide such wiring. To deal with this, in the present embodiment, in addition to the first surface (connector implement surface) (FIG. 15A), the flexible electric wiring substrate 202 has a second surface (no-connector implementing surface) (FIG. 15C). In other words, the flexible electric wiring substrate 202 is a two-sided wiring substrate. Additionally, the wiring that connects the plating lead 250 with the connector land 251 in the row on the side far from the one end portion, on the side including the plating leads 250, of the flexible electric wiring substrate 202 in the longitudinal direction is provided to both of the first and second surfaces. Moreover, the wiring provided to the first surface and the wiring provided to the second surface are connected through a via. With this, the wiring that passes between the connector lands 251 in the row on the side close to the one end portion, on the side including the plating leads 250, of the flexible electric wiring substrate 202 in the longitudinal direction is unnecessary.

Note that, in the present embodiment, as illustrated in FIG. 15B, a pitch of the plating leads 250*s* is wider than a pitch of terminals, i.e., pins, of the connector 252, that is the same as a pitch of the connector lands 251. However, it is not limited thereto, and the pitch of the plating leads 250 may be the same as the pitch of the terminals of the connector 252, and for example, as described in a third embodiment and a fourth embodiment, the pitch of the plating leads 250 may be narrower than the pitch of the terminals of the connector 252.

Figure 16:
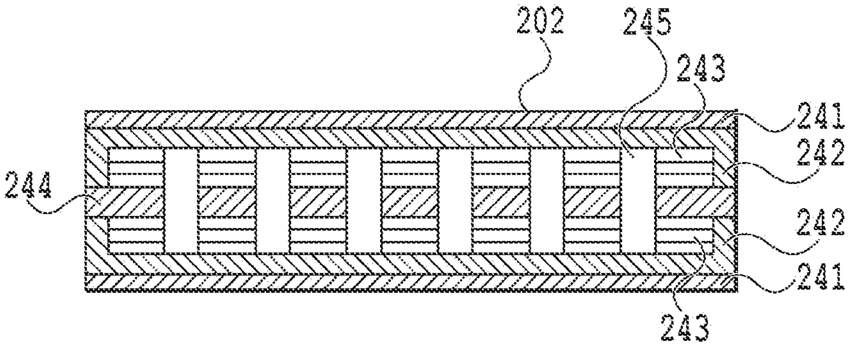
FIG. 16 is a cross-sectional view illustrating a cross-section of a part of the flexible electric wiring substrate according to the embodiment.

FIG. 16 is a partial cross-sectional view taken along a cross-section line XVI-XVI illustrated in the plan view in FIG. 15A. As illustrated in FIG. 16, the flexible electric wiring substrate 202 according to the present embodiment is wired in two layers. Two copper foils 243 are directly adhered to two surfaces of a base film 244, respectively, and two coverlays 241 are respectively adhered on tops of the upper and lower copper foils 243 with upper and lower adhesives 242 applied therebetween. In other words, the coverlay 241 is adhered to the two surfaces in a basic portion of the flexible electric wiring substrate 202.

Unlike the portion of the cross-section illustrated in FIG. 16, in a portion onto which the probe 255 is abutted, the plating lead 250 needs to be exposed to a surface. For this reason, in FIG. 15A, the coverlay 241 is not arranged in a region surrounded by a frame 260. In other words, the coverlay 241 is not arranged in the one end portion (peripheral portion), on the side including the plating leads 250, of the flexible electric wiring substrate 202 in the longitudinal direction. Accordingly, on the side of the one end portion, the plating leads 250 are not covered with the coverlay 241 in respective regions near the end portion, and on the other hand, on the side of the one end portion, the plating leads 250 are covered with coverlay 241 in the other regions. Note that, the portion of each of the plating leads 250 that is not covered with the coverlay 241 may be provided in a position away from the one end portion. With a description using FIG. 15A, an upper side of the frame 260 may be moved downward such that the upper side of the frame 260 is arranged lower than an upper side of the flexible electric wiring substrate 202.

Figure 17:
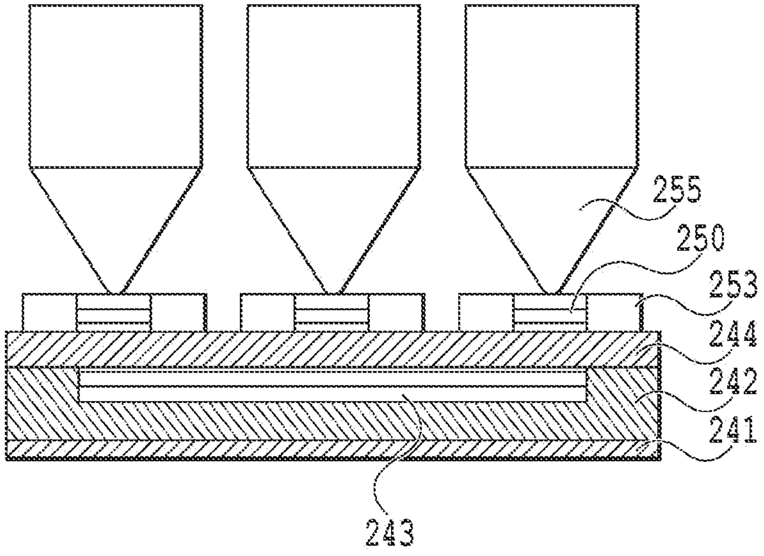
FIG. 17 is a cross-sectional view illustrating a cross-section of a portion of the flexible electric wiring substrate according to the embodiment onto which an inspection probe is abutted.

FIG. 17 is a partial cross-sectional view taken along a cross-section line XVII-XVII illustrated in the plan view in FIG. 15A. Unlike the portion of the cross-section illustrated in FIG. 16, in the portion of the cross-section illustrated in FIG. 17 (the region surrounded by the frame 260), the coverlay 241 and the adhesive 242 are not disposed, and the plating leads 250 are exposed to the surface. With this, it is possible to directly abut the probes 255 onto the plating leads 250. Note that, expanded portions 253 illustrated in FIG. 17 are portions of the plating leads 250 with respective wide widths and is described later.

Note that, although it is not illustrated, the wire bonding pads 258*s* and the connector lands 251 are also exposed to a surface, and in these portions, the coverlay 241 and the adhesive 242 are not arranged.

As a method of manufacturing the flexible electric wiring substrate 202, the flexible electric wiring substrate 202 can be manufactured in the order of performing gold plating processing on the entirety of the copper foil 243, and then adhering the coverlay 241 by the adhesive 242. In this case, in adhering the coverlay 241, the coverlay 241 is not adhered to the wire bonding pads 258, the connector lands 251, and at least a part of each of the plating leads 250 by the adhesive 242. In other words, an opening in which the coverlay 241 and the adhesive 242 are not arranged is provided on the wire bonding pad 258, the connector land 251, at least a part of each of the plating leads 250. With this, the wire bonding pad 258, the connector land 251, and at least a part of each of the plating leads 250 on which the gold plating is performed are exposed to a surface.

Additionally, it is also possible to manufacture the flexible electric wiring substrate 202 in the order of adhering the coverlay 241 by the adhesive 242, and then performing the gold plating processing on only the opening portion in which the coverlay 241 and the adhesive 242 are not arranged. In this case, in adhering the coverlay 241 using the adhesive 242, the coverlay 241 is not adhered to the wire bonding pad 258, the connector land 251, and at least a part of each of the plating leads 250. In other words, the opening in which the coverlay 241 and the adhesive 242 are not arranged is provided on the wire bonding pad 258, the connector land 251, and at least a part of each of the plating leads 250. With this, the wire bonding pad 258, the connector land 251, and at least a part of each of the plating leads 250 on which the gold plating is performed are exposed to a surface.

Second Embodiment

Figure 18A:
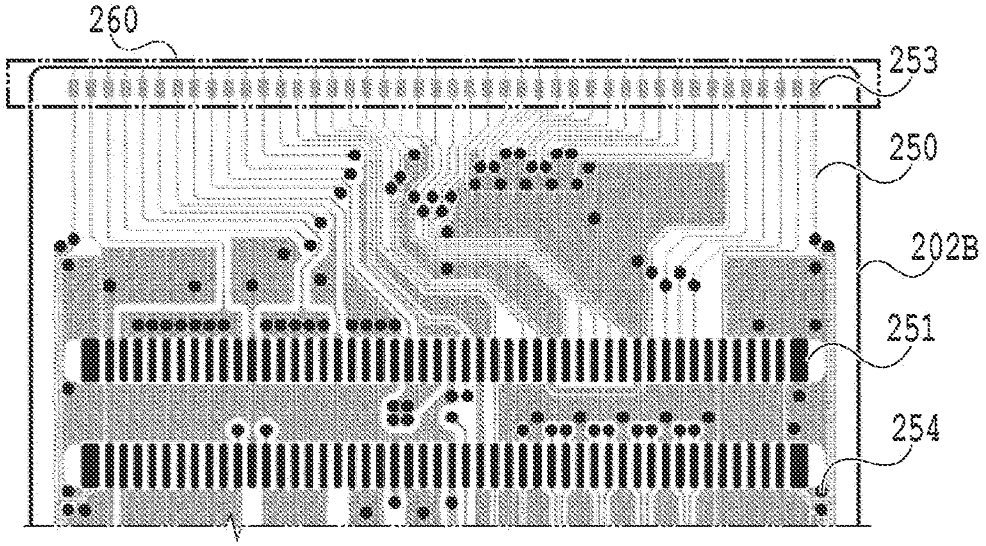
FIGS. 18A and 18B are plan views each illustrating a part of a flexible electric wiring substrate of a second embodiment.
Figure 18B:
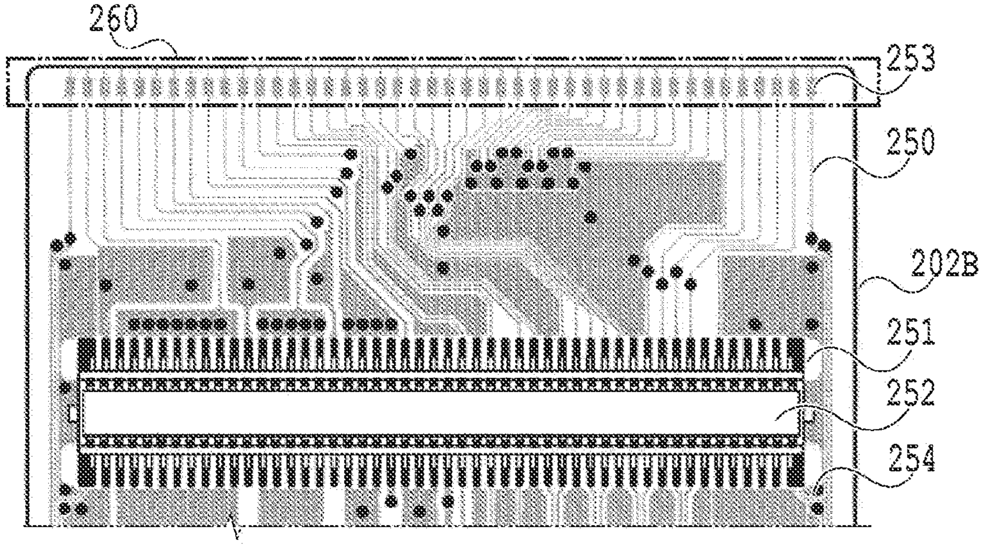

FIG. 18A illustrates a first surface of a flexible electric wiring substrate 202B according to a second embodiment, and FIG. 18B illustrates the first surface of the flexible electric wiring substrate 202B according to the second embodiment and the connector 252 implemented thereon. The flexible electric wiring substrate 202B according to the second embodiment is different from the flexible electric wiring substrate 202 according to the first embodiment in that the expanded portion 253 is added to the plating lead 250. Note that, a second surface of the flexible electric wiring substrate 202B according to the second embodiment is the same as the second surface of the flexible electric wiring substrate 202 according to the first embodiment illustrated in FIG. 15C.

Since the plating lead 250 is not a wiring that is required to flow a continuous great current for a long time, in general, a thin wiring of 0.1 mm or smaller is used for the plating lead 250. In order that the probes 255 of the inspection device are abutted onto the plating leads 250 as illustrated in FIG. 17, it is necessary to accurately align the positions of the probes 255 and the plating leads 250.

In a case where tips of the probes 255 are too thin, the probes 255 stick in the plating leads 250 and make holes in the plating leads 250, and at worst, there is a possibility that the plating leads 250 are cut off. Therefore, it can be considered to make the tips of the probes 255 thick; however, in a case where the plating leads 250 are thin, there is a possibility that the probes 255 slide off side end portions of the plating leads 250 onto the base film 244, and the electric connection cannot be established. Additionally, in such a case, there is also a possibility that the probes 255 are put in contact with other adjacent plating leads 250.

Therefore, in the present embodiment, a portion of each of the plating leads 250 onto which the probe 255 is abutted is expanded in width. That is, in the present embodiment, as illustrated in FIG. 18A, the expanded portions 253 is provided in a part of each of the plating leads 250. This allows for easy abutting of the probes 255 onto the expanded portions 253 of the plating leads 250 and prevents the probes 255 from sliding off the side end portions of the expanded portions 253 of the plating leads 250 onto the base film 244. Additionally, in a probe holding substrate 256 (FIGS. 20A and 20B) in which the probes 255 are arrayed and held, a certain amount of margin is brought to a pitch of the holes into which the probes 255 are inserted and to a dimension accuracy such as tolerance. Accordingly, there is also an advantage that it is easy to manufacture the probe holding substrate 256.

As illustrated in FIG. 18A, in the present embodiment, the expanded portion 253 is provided in only a part of each of the plating leads 250; however, if the wiring interval of the plating leads 250 is wide, the entirety of the plating lead 250 may be the expanded portion 253 for each plating lead 250.

In the present embodiment illustrated in FIGS. 18A and 18B, as with the first embodiment illustrated in FIGS. 15A to 15C, the pitch of the plating leads 250 is wider than the pitch of the terminals of the connector 252.

Third Embodiment

Figure 19A:
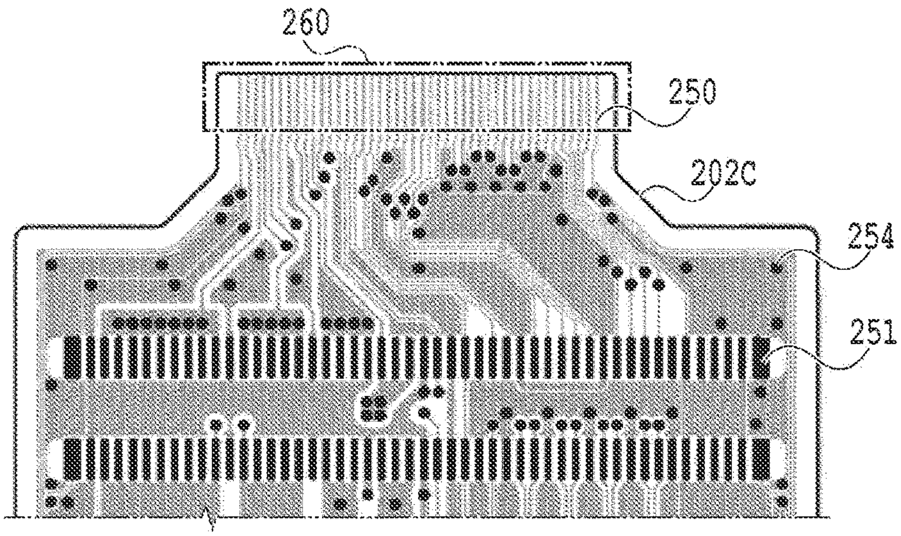
FIGS. 19A, 19B, and 19C are plan views each illustrating a part of a flexible electric wiring substrate of a third embodiment.
Figure 19B:
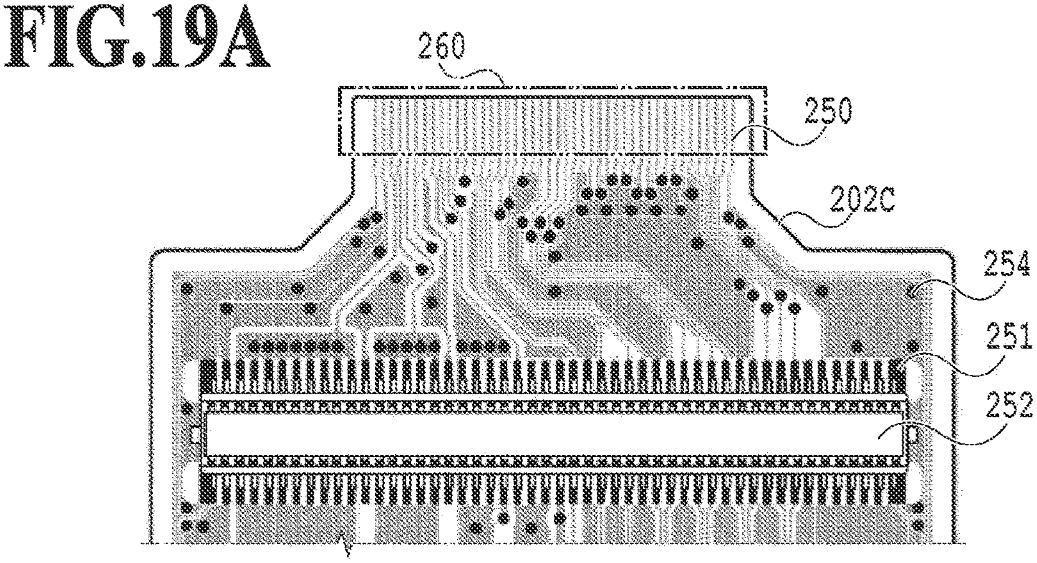
Figure 19C:
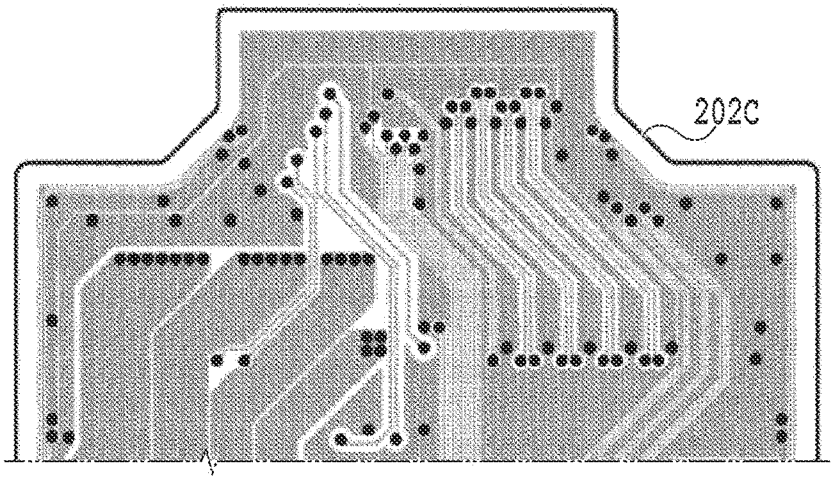

FIG. 19A illustrates a first surface of a flexible electric wiring substrate 202C according to a third embodiment, and FIG. 19B illustrates the first surface of the flexible electric wiring substrate 202C according to the third embodiment and the connector 252 implemented therein. FIG. 19C illustrates a second surface of the flexible electric wiring substrate 202C according to the third embodiment. The flexible electric wiring substrate 202C according to the third embodiment is different from the flexible electric wiring substrate 202 according to the first embodiment in the following points. The first point is that the pitch of the plating leads 250 is narrow. And the second point is that a width of the one end portion, in which the plating leads 250 are provided, of the flexible electric wiring substrate 202C in a longitudinal direction is narrower than another portion.

Figure 20A:
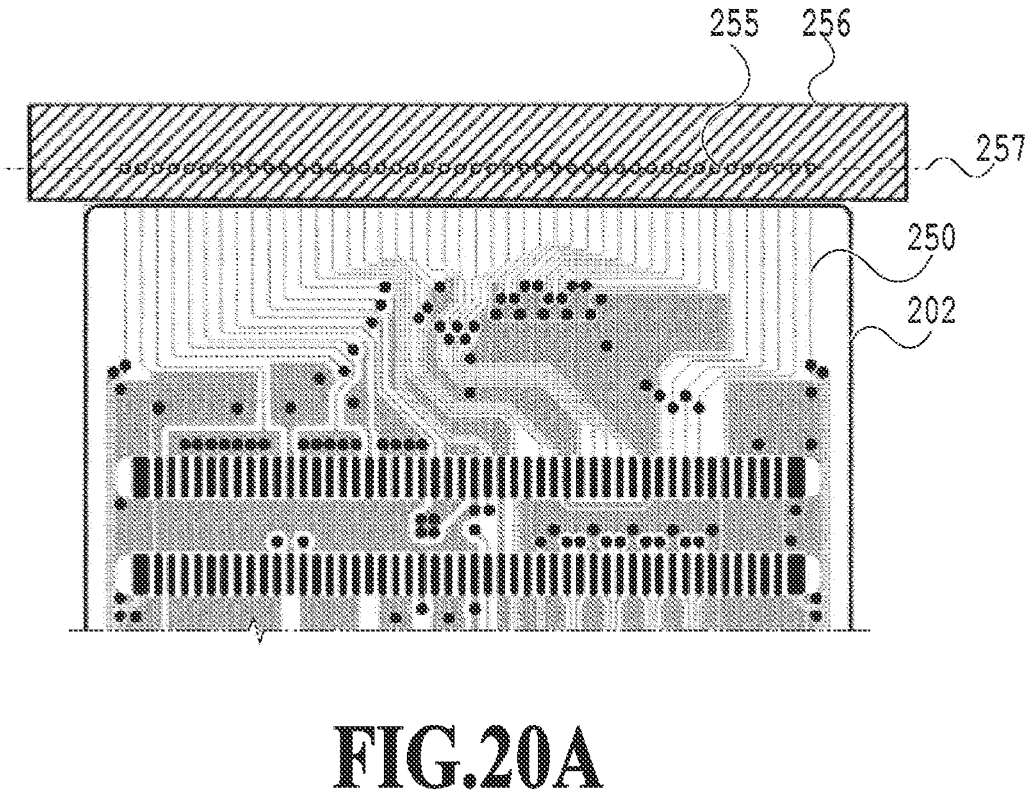
FIGS. 20A and 20B are respectively a plan view and a cross-sectional view illustrating the flexible electric wiring substrate of the first embodiment and the inspection probe held by a probe holding substrate.
Figure 20B:
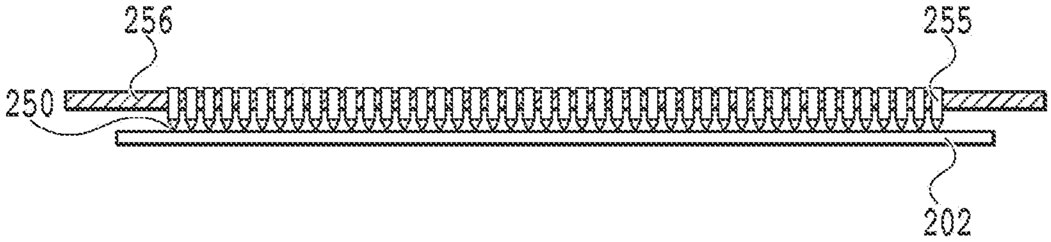

In a case where the wiring interval of the plating leads 250 is about 0.5 mm, for example, an outer shape of the flexible electric wiring substrate needs to be great. Additionally, as illustrated in FIGS. 20A and 20B, in the inspection, it is necessary to hold the probes 255 by the probe holding substrate 256 to arrange the probes 255 in a row, and to put such probes 255 in contact with the plating leads 250 arrayed in a row. Accordingly, it is also necessary to increase the size of the probe holding substrate 256.

For example, in a case where the probes 255 having a diameter of 0.3 mm are arrayed at intervals of 0.5 mm in accordance with the wiring interval of the plating leads 250, a distance between the probes 255 is 0.2 mm. Accordingly, on the probe holding substrate 256, it is necessary to array many holes for the probe insertion having a diameter of 0.3 mm while leaving a portion having a slight width of 0.2 mm as a residual portion. Accordingly, a region of the probe holding substrate 256 in which the many holes are arrayed has a weak strength, and the durability is also reduced.

Additionally, even in a case where it is intended that the probes 255 are abutted onto all the plating leads 250, there is a possibility that the probe holding substrate 256 is bent due to a reaction force from the plating leads 250 to some of the probes 255, and the rest of the probes do not abut onto the plating leads 250. In other words, there is a possibility that the probe holding substrate 256 is bent into the form of an arch with the vicinity of the center in an array direction of the probes 255 being raised, and in this case, there is a possibility that the probes 255 in the vicinity of the center do not abut onto the corresponding plating leads 250. Note that, FIG. 20B illustrates a state in which the probe holding substrate 256 is not bent, and all the probes 255 are abutted onto the corresponding plating leads 250.

Figure 21A:
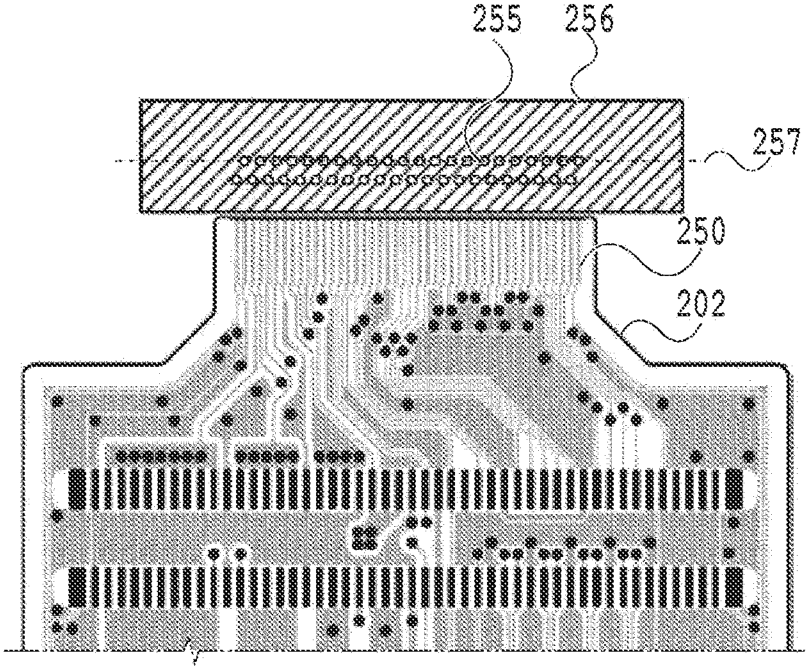
FIGS. 21A and 21B are respectively a plan view and a cross-sectional view illustrating the flexible electric wiring substrate of the third embodiment and the inspection probe held by the probe holding substrate.
Figure 21B:
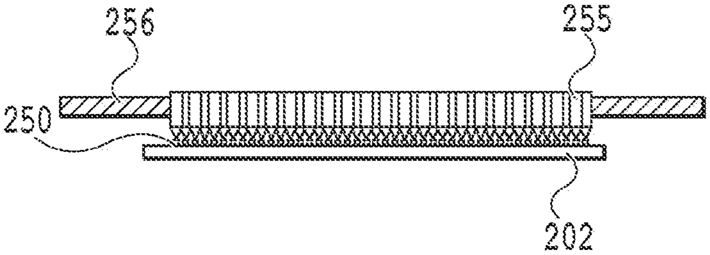

In order to reduce the bending, in the present embodiment, the flexible electric wiring substrate 202 and the probe holding substrate 256 have configurations illustrated in FIGS. 21A and 21B. In other words, in the present embodiment, as illustrated in FIGS. 21A and 21B, the array pitch of the plating leads 250 is short to be 0.2 mm, for example. Additionally, the probes 255 are grouped into two rows and arrayed in two-row staggered arrangement such that the probes 255 having a diameter of 0.3 mm are abutted onto all the plating leads 250 arrayed at a pitch of 0.2 mm. In other words, the probes 255 arrayed in two rows, and the probes 255 arrayed in one of the rows and the probes arrayed in the other of the rows are arrayed to be staggered in an array direction. With the two rows being combined, the array pitch of the probes 255 is reduced to 0.2 mm; for this reason, it is possible to abut all the probes 255 onto the plating leads 250 arrayed at a pitch of 0.2 mm. Moreover, in terms of each row, the array pitch of the probes is 0.4 mm; for this reason, it is possible to array the probes 255 having a diameter of 0.3 mm in a row on the probe holding substrate 256.

Note that, although the width of the one end portion, on the side on which the plating lead 250 is arranged, of the flexible electric wiring substrate 202C in the longitudinal direction may be narrower than a width of the other portion as illustrated in FIGS. 19A to 19C and FIGS. 21A and 21B, it is not limited thereto. For example, an outer shape of the flexible electric wiring substrate 202C may be similar to that in the first embodiment.

Additionally, in accordance with the reduction in a distribution length of the probes 255 in the array direction of the probes 255 on the probe holding substrate 256 as illustrated in FIGS. 21A and 21B, an entire length of the probes on the probe holding substrate 256 in the array direction may be short; however, it is not limited thereto. For example, the holes for the probe insertion as illustrated in FIGS. 21A and 21B may be provided in the probe holding substrate 256 having the outer shape as illustrated in FIGS. 20A and 20B.

According to the present embodiment, it is possible to reliably abut the probes 255 onto all the plating leads 250. Additionally, it is also possible to reduce the size of the probes and to reduce the size of the inspection device including the probes.

Fourth Embodiment

Figure 22A:
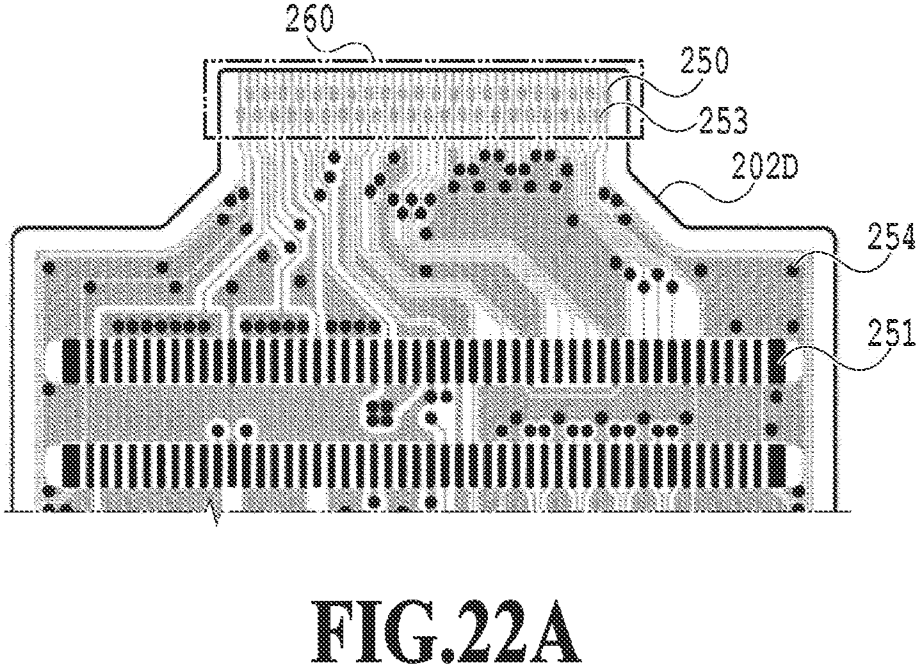
FIGS. 22A and 22B are a plan view each illustrating a part of a flexible electric wiring substrate of a fourth embodiment.
Figure 22B:
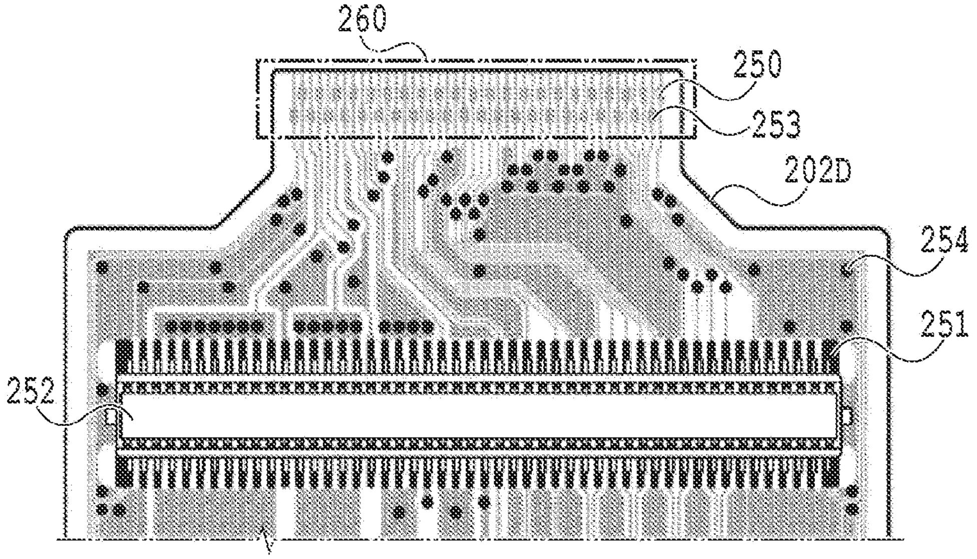

FIG. 22A illustrates a first surface of a flexible electric wiring substrate 202D according to a fourth embodiment, and FIG. 22B illustrates the first surface of the flexible electric wiring substrate 202D according to the fourth embodiment and the connector 252 implemented therein. The flexible electric wiring substrate 202D according to the fourth embodiment is different from the flexible electric wiring substrate 202C according to the third embodiment in that the expanded portion 253 is added to the plating lead 250. Note that, a second surface of the flexible electric wiring substrate 202D according to the fourth embodiment is the same as the second surface of the flexible electric wiring substrate 202C according to the third embodiment as illustrated in FIG. 19C.

As illustrated in FIG. 22A, in the present embodiment, the expanded portions 253 are arrayed in two-row staggered arrangement. With such an array of the expanded portions 253, it is possible to avoid interference between the expanded portions 253 provided in the plating leads 250 adjacent to each other. Additionally, with such an array of the expanded portions 253, it is possible to abut the probes 255 held by the probe holding substrate 256 used in the third embodiment onto the expanded portions 253 provided in the plating leads 250 of the flexible electric wiring substrate 202D according to the present embodiment.

In the example in FIG. 22A, $w \approx p$ is obtained where the pitch of the plating leads 250 is p, and the width of the expanded portion 253 is w. However, unless the expanded portion 253 interferes the adjacent plating lead 250, the width of the expanded portion 253 may be increased to be $w > p$. In this case, the expanded portions 253 included, respectively, in the plating leads 250 adjacent to each other in the direction in which the plating leads 250 are arrayed are overlapped with each other in the direction in which the plating leads 250 are arrayed. With this, it is possible to increase the effect as described in the second embodiment. On the other hand, the width of the expanded portion 253 may be reduced to be $w < p$. For example, it may be around $w \approx (2/3) \times p$. In this case, the expanded portions 253 included, respectively, in the plating leads 250 adjacent to each other in the direction in which the plating leads 250 are arrayed are away from each other in the direction in which the plating leads 250 are arrayed. With this, it is also possible to achieve the effect as described in the second embodiment.

Other Embodiments

In the example illustrated in FIGS. 20A and 20B, the pitch of the plating leads 250 is the same as the pitch of the probes 255 arrayed on the probe holding substrate 256. Therefore, in a case where the array direction of the probes 255 coincides with the array direction of the plating leads 250, it is possible to abut all the probes 255 onto all the corresponding plating leads. The pitch of the plating leads 250 may be smaller than the pitch of the probes 255 arrayed on the probe holding substrate 256. In such a case, it is also possible to abut all the probes 255 onto all the corresponding plating leads by inclining the array direction of the probes 255 with respect to the array direction of the plating leads 250. The same applies to the example illustrated in FIG. 21. In other words, although the pitch of the plating leads 250 is the same as the pitch of the multiple inspection probes 255 arrayed in the two-row staggered arrangement on the probe holding substrate 256 in a case where the two rows are combined into one row in the example illustrated in FIG. 21, the pitch of the plating leads 250 may be smaller.

Instead of the wire bonding, lead bonding may be used. In this case, the lead terminal and the bonding pad are connected to each other. The present disclosure is not limited to the bonding pad as long as it is a pad that connects a terminal of an electronic part and wiring of a flexible electric wiring substrate.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2023-062973, filed on Apr. 7, 2023, which is hereby incorporated by reference wherein in its entirety.

What is claimed is:

1. A flexible electric wiring substrate, comprising:

a plurality of groups each including:

- a wiring,
- a connector land that electrically connects a terminal of a connector to the wiring,
- a pad that connects a terminal of an electronic part to the wiring, and
- a plating lead that is electrically connected with the pad through the wiring and is configured to serve as a current supply port for electrolytic plating of the pad, wherein in each of the plurality of groups, the connector land, the pad, and the plating lead are electrically connected with each other through the wiring, and a plurality of the plating leads are arranged such that each of a plurality of inspection probes arrayed on a probe holding substrate is abutted onto each plating lead.

2. The flexible electric wiring substrate according to claim 1, wherein a pitch of the plurality of the plating leads is equal to or smaller than a pitch of the plurality of the inspection probes arrayed in a row on the probe holding substrate.

3. The flexible electric wiring substrate according to claim 1, wherein a pitch of the plurality of the plating leads is equal to or smaller than a pitch of the plurality of the inspection probes arrayed in two rows in staggered arrangement on the probe holding substrate in a case where the two rows are combined into one row.

4. The flexible electric wiring substrate according to claim 1, wherein a part of each plating lead is exposed to a surface, and the rest is covered with a coverlay.

5. The flexible electric wiring substrate according to claim 4, wherein the portion of each plating lead that is exposed to the surface includes a portion onto which each inspection probe is abutted.

6. The flexible electric wiring substrate according to claim 1, wherein each plating lead includes an expanded portion, and a plurality of the plating leads and the expanded portions are arranged such that each inspection probe is abutted onto the expanded portion included in each plating lead.

7. The flexible electric wiring substrate according to claim 6, wherein the expanded portions included in the plurality of the plating leads, respectively, are arrayed in two rows in staggered arrangement.

8. The flexible electric wiring substrate according to claim 7, wherein in a direction in which the plating leads are arrayed, a pitch of the plurality of the plating leads is provided so as to be equal to or smaller than a length of each expanded portion.

9. The flexible electric wiring substrate according to claim 1, wherein the plurality of the plating leads are arranged in one end portion of the flexible electric wiring substrate in a longitudinal direction.

10. The flexible electric wiring substrate according to claim 1, wherein a pitch of the plurality of the plating leads is wider than a pitch of a plurality of the connector lands.

11. The flexible electric wiring substrate according to claim 1, wherein a pitch of the plurality of the plating leads is narrower than a pitch of a plurality of the connector lands.

12. The flexible electric wiring substrate according to claim 1, wherein the plurality of the plating leads are arranged in one end portion of the flexible electric wiring substrate in a longitudinal direction, a pitch of the plurality of the plating leads is narrower than a pitch of a plurality of the connector lands, and a width of the one end portion of the flexible electric wiring substrate in the longitudinal direction is narrower than a width of a portion of the flexible electric wiring substrate except the one end portion in the longitudinal direction.

13. The flexible electric wiring substrate according to claim 12, wherein each plating lead includes an expanded portion, and the expanded portions included in the plurality of the plating leads, respectively, are arrayed in two rows in staggered arrangement.

14. The flexible electric wiring substrate according to claim 13, wherein in a direction in which the plating leads are arrayed, a pitch of the plurality of the plating leads is provided as to be equal to or smaller than a length of each expanded portion.

15. The flexible electric wiring substrate according to claim 1, wherein electrolytic plating is performed on the connector land, the plating lead, and the pad.

16. A chip unit, comprising:

the flexible electric wiring substrate according to the claim 1; and a driving element substrate on which a plurality of driving elements are mounted, wherein a plurality pieces of the wiring include;

a first wiring that communicates a plurality of driving signals to drive each driving element and a second wiring that communicates a driving signal selection signal to select the driving signals to be supplied to each driving element from the plurality of the driving signals, and the electronic part is an electronic part that functions as a driving signal selection unit that supplies a signal obtained by synthesizing the driving signals selected based on the driving signal selection signal to each driving element.

17. The chip unit according to claim 16, wherein the plurality pieces of the wiring further include third wiring for power supply, and the power supply is supplied to the driving signal selection unit from the third wiring.

18. The chip unit according to claim 16, wherein the plurality pieces of the wiring further include fourth wiring that communicates a residual vibration voltage generated in the driving element.

19. The chip unit according to claim 16, wherein electrolytic plating is performed on the connector land, the plating lead, and the pad.

* * * * *